United States Patent
Biddle et al.

(10) Patent No.: US 8,911,240 B2
(45) Date of Patent: Dec. 16, 2014

(54) RIGHT-ANGLE BOARD-MOUNTED CONNECTORS

(71) Applicant: Samtec, Inc., New Albany, IN (US)

(72) Inventors: Gary Ellsworth Biddle, Carlisle, PA (US); Christopher Warren Shelly, Harrisburg, PA (US)

(73) Assignee: Samtec, Inc., New Albany, IN (US)

( * ) Notice: Subject to any disclaimer, the term of this patent is extended or adjusted under 35 U.S.C. 154(b) by 46 days.

(21) Appl. No.: 13/843,556

(22) Filed: Mar. 15, 2013

(65) Prior Publication Data

US 2014/0273550 A1 Sep. 18, 2014

(51) Int. Cl.
H01R 12/00 (2006.01)
H01R 12/70 (2011.01)
H05K 1/11 (2006.01)

(52) U.S. Cl.
CPC ............ *H01R 12/7005* (2013.01); *H05K 1/111* (2013.01)
USPC .......................................................... 439/63

(58) Field of Classification Search
CPC ...................................................... H01R 24/50
USPC ..................................... 439/63, 581; 333/260
See application file for complete search history.

(56) References Cited

U.S. PATENT DOCUMENTS

| | | | | |
|---|---|---|---|---|
| 4,645,288 A * | 2/1987 | Stursa | ............................ | 439/581 |
| 6,264,475 B1 * | 7/2001 | Machado | ........................ | 439/63 |
| 6,474,995 B1 * | 11/2002 | Wu | ................................. | 439/63 |
| 6,902,408 B2 * | 6/2005 | Yamane | ........................... | 439/63 |
| 7,118,383 B2 * | 10/2006 | Nagata et al. | ................... | 439/63 |
| 7,150,648 B1 * | 12/2006 | Hall et al. | ...................... | 439/581 |
| 7,274,271 B2 * | 9/2007 | Lee | .................................... | 333/33 |
| 7,367,811 B2 * | 5/2008 | Nagata | ............................. | 439/63 |
| 7,436,268 B2 * | 10/2008 | Jiang et al. | ...................... | 333/34 |
| 7,443,272 B2 * | 10/2008 | Jiang et al. | ................... | 333/260 |
| 7,445,458 B1 * | 11/2008 | Yamane | ............................ | 439/63 |
| 7,484,965 B2 * | 2/2009 | Chien et al. | ..................... | 439/63 |
| 7,540,771 B2 * | 6/2009 | Lee et al. | ....................... | 439/581 |
| 7,575,474 B1 * | 8/2009 | Dodson et al. | ................ | 439/581 |
| 7,651,334 B2 * | 1/2010 | Zhang | ............................. | 439/63 |
| 7,717,716 B2 * | 5/2010 | Dahms | ............................ | 439/63 |
| 7,750,765 B2 * | 7/2010 | Kushta et al. | ................. | 333/260 |

(Continued)

FOREIGN PATENT DOCUMENTS

KR 10-2007-0028526 A 3/2007
KR 10-2010-0078355 A 7/2010

OTHER PUBLICATIONS

Official Communication issued in corresponding International Patent Application PCT/US2013/036265, mailed on Dec. 20, 2013.

*Primary Examiner* — Ross Gushi
(74) *Attorney, Agent, or Firm* — Keating & Bennett, LLP

(57) ABSTRACT

A connector includes a housing including a conductive material, a base connected to the housing and including a base center hole and a base groove extending from the base center hole to an edge of the base, a center pin including a first portion and a second portion extending perpendicular or substantially perpendicular to the first portion, and a dielectric. The dielectric includes a first portion extending through the base center hole and including a dielectric center hole through which the first portion of the center pin extends and a second portion extending perpendicular or substantially perpendicular to the first portion of the dielectric along the base groove and including a dielectric groove along which the second portion of the center pin extends.

16 Claims, 27 Drawing Sheets

(56) References Cited

U.S. PATENT DOCUMENTS

| | | | |
|---|---|---|---|
| 7,766,662 B2 * | 8/2010 | Akama et al. | 439/63 |
| 7,802,993 B2 * | 9/2010 | Akama et al. | 439/63 |
| 7,896,666 B2 * | 3/2011 | Tung et al. | 439/141 |
| 7,940,143 B2 * | 5/2011 | Chang et al. | 333/33 |
| 7,976,315 B2 * | 7/2011 | Zuinen et al. | 439/63 |
| 7,985,076 B2 * | 7/2011 | Zuinen et al. | 439/63 |
| 7,993,144 B2 * | 8/2011 | Hu et al. | 439/63 |
| 8,169,276 B2 * | 5/2012 | Chang et al. | 333/33 |
| 8,262,398 B2 * | 9/2012 | Chen | 439/188 |
| 8,540,523 B2 * | 9/2013 | Cornic et al. | 439/63 |
| 2005/0026498 A1 | 2/2005 | Ikeda et al. | |
| 2006/0024985 A1 | 2/2006 | Nagata et al. | |
| 2006/0259185 A1 | 11/2006 | Berdelle-Hilge | |
| 2008/0045043 A1 * | 2/2008 | Lee et al. | 439/63 |
| 2008/0121421 A1 | 5/2008 | Kashiwakura | |
| 2008/0254676 A1 * | 10/2008 | Chien et al. | 439/581 |
| 2009/0117779 A1 * | 5/2009 | Zhang | 439/581 |
| 2011/0217853 A1 * | 9/2011 | Cornic et al. | 439/63 |

* cited by examiner

RIGHT-ANGLE BOARD-MOUNTED CONNECTORS

BACKGROUND OF THE INVENTION

1. Field of the Invention

The present invention relates to right-angle board-mounted connectors and their printed circuit board (PCB) footprints. More specifically, the present invention relates to right-angle board-mounted connectors and PCB footprints with improved coaxial structure.

2. Description of the Related Art

It is known to use a board-mounted connector to connect a coaxial cable to a PCB. An example of such a known connector 100 is shown in FIGS. 19-21. The connector 100 includes a housing 101 that mates with a corresponding connector of the coaxial cable (not shown) and a base 102 that can be soldered to PCB 105. The connector 100 also includes a center pin 104 that connects with a center conductor (not shown) of the coaxial cable and with a trace (not shown in FIGS. 19 and 20 but shown as trace 113 and 213 in FIGS. 22 and 24) on the PCB 105. The connection between the center conductor of the coaxial cable, the center pin 104 of the connector 100, and the trace of the PCB 105 allows signals to be transmitted between the PCB 105 and the coaxial cable. The connector 100 also include a dielectric 103 arranged in the bottom of the base 102 that surrounds the center pin 104. The center pin 104 has an L-shape with a first portion that extends along the central axis of the housing 101 and with a second portion that is perpendicular to the first portion and that extends parallel to the surface of the PCB 105. The shape of the dielectric 103 is toroidal with the center pin 104 extending through the center hole of the toroid and along a radial groove. That is, the dielectric 103 has a disk-like shape with a hole in the center and groove extending from the hole to the edge of the disk.

FIG. 26 shows another known connector 150. This connector 150 is similar to the connector 100 of FIG. 19, except that the connector 150 includes legs 156 that can be grounded when the connector 150 is mounted to PCB 160. Legs 156 are inserted into holes in the PCB 160 and are connected to ground in or on the PCB 160. Connector 150 includes a housing 151 that mates with a corresponding connector of a coaxial cable and a base 152 that can be soldered to PCB 160. The connector 150 also includes a center pin 154 that connects with a center conductor of the coaxial cable and with a trace on the PCB 160. The connector 150 also includes a dielectric 153 arranged in the bottom of the base 152 that surrounds the center pin 154. The center pin 154 has an L-shape with a first portion that extends along the central axis of the housing 151 and with a second portion that is perpendicular to the first portion and that extends parallel to the surface of the PCB 160. The shape of the dielectric 153 is toroidal with the center pin 154 extending through the center hole of the toroid and along a radial groove. That is, the dielectric 153 has a disk-like shape with a hole in the center and groove extending from the hole to the edge of the disk.

A coaxial cable has a center conductor that is surrounded by a dielectric that is surrounded by an outer shield. The shield provides a conductive surface that shields signals transmitted in the dielectric and defines the outer boundary of the transmission line. Transmitted signals in the dielectric couple from the center conductor to the shield's inner conductive surface. To maintain signal integrity, the connectors attempt to approximate or mirror the coaxial structure of the coaxial cable. However, the connector 100, 150 inexactly approximates this coaxial structure (i.e., a conductor that is surrounded by a dielectric that is surrounded by a shield). The housing 101, 151 of the connector 100, 150 is typically made of a conductive material and corresponds to the shield of the coaxial cable. The center pin 104, 154 is also typically made of a conductive material and corresponds to the center conductor of the coaxial cable. The dielectric 103, 153 is made of a dielectric material and corresponds to the dielectric in the coaxial cable.

High-speed signals act like guided waves. A uniform guiding system from beginning to end with no abrupt changes in geometry or impedance is ideal. One of the problems with the connectors 100, 150 is that the center pin 104 makes a 90° bend and then travels along the bottom surface of the base 102, which causes an abrupt change in the geometry and in the impedance. The signal transmitted by the portion of the center pin 104 extending along the printed circuited board couples with the closest conductive surface, which is the flat inside surface of the base 102, and thus the structure is no longer coaxial. When the connectors 100, 150 are mated with a coaxial cable, the signals transmitted between the connector 100, 150 and the coaxial cable experience this abrupt change in the coaxial structure.

Another of the problems with the connectors 100, 150 is that they provide only a two-dimensional interface between the connector 100, 150 and the PCB 105, 160 (the flat bottom surface of the connector 100, 150 that is soldered to the PCB 105, 160). When the connectors 100, 150 are mounted to a PCB 105, 160, the signals transmitted between the connector 100, 150 and the PCB 105, 160 experience an abrupt change in the coaxial structure because of this two-dimensional interface.

The legs 156 of the connector 150 do not help the connector 150 approximate the coaxial structure because the legs 156 are located too far away, even farther away from the center pin 154 than the shield is from the center conductor of a coaxial cable. That is, the legs 156 are located outside of the outer boundary of the transmission line defined by the footprint. Thus, the legs 156 have little effect other than mounting the connector 150 to the PCB 160 and providing ground continuity between the connector 150 and the PCB 160.

A coaxial cable can also have an outer sheath, but this is not typically mirrored in a connector.

Because the connector 100, 150 inexactly approximates the coaxial structure, signals transmitted through the PCB 105, 160 and the coaxial cable experience an impedance mismatch when the signals are transmitted through the connector 100, 150. This impedance mismatch decreases performance with higher frequencies. The larger the impedance mismatch, the worse the signal integrity, as shown in FIGS. 15-18.

FIGS. 22 and 23 show PCB 110 with a known footprint for the connector 100. The footprint of a printed circuit board refers to the layout of the structures on the PCB (e.g., ground planes, vias, traces, etc.) that are required to mount a component, which in FIGS. 22 and 23 is connector 100. The footprint is sometimes referred to as the break-out region (BOR). The footprint includes a base pad 112 and a pin pad 114. The base 102 is soldered to the base pad 112, and the center pin 104 is soldered to the pin pad 114. The pin pad 114 is connected to a trace 113 that leads away from the pin pad 114. The footprint also includes a ground plane 115 that surrounds trace 113.

FIG. 23 is a see-through perspective view of the footprint of FIG. 22 in which structures within the PCB 110 are shown using broken lines. These structures cannot normally be seen. The PCB 110 typically includes multiple layers. The layer nearest to the surface of the PCB 110 includes a ground plane 116. The ground plane 116 includes an antipad 117 underneath the pin pad 114. The ground plane 116 is connected to the ground plane 115 on the top of the PCB 110 by vias 118. The reference lines for ground plane 116 and antipad 117 are broken to show that the ground plane 116 and the antipad 117 are within the PCB 110.

FIGS. 24 and 25 show PCB 210 with another known footprint for the connector 100. This footprint is similar to the footprint of FIGS. 22 and 23, except that base pad 112 of FIGS. 22 and 23 and the base pad 212 of FIGS. 24 and 25 have different interior shapes. The base 102 is soldered to the base pad 212, and the center pin 104 is soldered to the pin pad 214. The pin pad 214 is connected to a trace 213 that leads away from the pin pad 214. The footprint also includes a ground plane 215 that surrounds trace 213.

FIG. 25 is a see-through perspective view of the footprint of FIG. 22 in which structures within the PCB 210 are shown using broken lines. The PCB 210 typically includes multiple layers. The layer nearest to the surface of the PCB 210 includes a ground plane 216. The ground plane 216 includes an antipad 217 underneath the pin pad 214. The ground plane 216 is connected to the ground plane 215 on the top of the PCB 110 210 by vias 218. The reference lines for ground plane 216 and antipad 217 are broken to show that the ground plane 216 and the antipad 217 are within the PCB 210.

The footprints of FIGS. 21-24 also inexactly approximate the coaxial structure of a conductor that is surrounded by a dielectric that is surrounded by a shield. The traces 113, 213 are surrounded on the sides by the ground planes 115, 215 on the top of the PCB 110, 210 and the vias 118, 218 connecting the ground planes 115, 215 and 116, 216. The traces 113, 213 are surrounded on the bottom by the ground planes 116, 216 on the layer within the PCB 115, 215 nearest the surface.

Known techniques to improve signal integrity focus on providing the best possible uniform wave guiding system, which is sometimes referred to as the transmission line. A fundamental parameter used to define a uniform guiding system is the characteristic impedance ($Z_o$). Today's high-speed data transmission is high frequency. This allows characteristic impedance $Z_o$ to be defined as the square root of the ratio of inductance L to capacitance C (i.e., $Z_o = \sqrt{(L/C)}$). The inductance and capacitance values are determined by the material properties and geometrical dimensions of the finite length of section of the guiding system. The known technique of impedance matching uses the material properties and geometrical dimensions of different sections of the wave guiding system to provide capacitance and inductance changing schemes to attempt to achieve the most overall uniform wave guiding system from start to finish. Such is the case for increasing the number of vias 118, 218 in PCB 110, 210 and changing the shape of antipads 111, 117, 211, 217.

Impedance matching for wave guide systems encompass many components, such as PCB traces, dielectric material, vias, antipads, interfaces, connectors, and interconnections. Known impedance matching techniques include [1] via optimization, [2] antipad optimization, [3] backdrilling techniques, [4] inductive compensation using curved PCB traces, and [5] new dielectric material laminates.

However, these known techniques for improving signal integrity in the PCB have limited ability to improve signal-integrity performance, particularly as the frequency of the signals increase. Ideally, the signals should propagate in the transverse electromagnetic (TEM) mode, with minimal loss and reflections.

FIGS. 15-18 compare the electrical characteristics of assembly of the connector 100 and the known footprint of FIG. 22 with the assemblies of the connectors and footprints of various preferred embodiments of the present invention. As shown in FIGS. 15 and 16, the insertion loss and the return loss are frequency dependent. The lower insertion loss is a combination of reflection losses, real losses, and non-TEM mode, causing a loss in transmission. FIGS. 17 and 18 show the near-end crosstalk (NEXT) and far-end crosstalk (FEXT) coupling of adjacent coaxial cable assemblies including a coaxial cable, a connector, and a footprint.

The known connector and footprint are typically designed to be used together to support high-speed data signals; however, improving one without improving the other has limited success in improving the overall signal integrity.

SUMMARY OF THE INVENTION

To overcome the problems described above, preferred embodiments of the present invention provide right-angle board-mounted connectors and corresponding footprints with improved electrical performance by improving their coaxial structure.

A connector according to a preferred embodiment of the present invention includes a housing including a conductive material, a base connected to the housing and including a base center hole and a base groove extending from the base center hole to an edge of the base, a center pin including a first portion and a second portion extending perpendicular or substantially perpendicular to the first portion, and a dielectric. The dielectric includes a first portion extending through the base center hole and including a dielectric center hole through which the first portion of the center pin extends and a second portion extending perpendicular or substantially perpendicular to the first portion of the dielectric along the base groove and including a dielectric groove along which the second portion of the center pin extends.

The connector preferably further includes an extension protruding from a bottom of the base. The extension preferably has a semi-circular shape or a U-shape. A radius of the extension and a radius of the base center hole preferably are equal or substantially equal.

The connector preferably further includes a leg extending from the base.

A radius of the base center hole and a radius of the base groove preferably are equal or substantially equal. A radius of the first portion of the dielectric and a radius of the second portion of the dielectric preferably are equal or substantially equal.

A printed circuit board according to a preferred embodiment of the present invention includes a base pad including an outer base pad portion and an inner base pad portion, the outer base pad portion is arranged to be connected to a base of a coaxial connector, a pin pad arranged such that at least a portion of the pin pad is surrounded by the base pad and arranged to be connected to a center pin of the coaxial connector, a trace connected to the pin pad, and a first ground plane located on a top surface of the printed circuit board including an antipad that surrounds the pin pad and the trace. The antipad extends into an area defined by an inner perimeter of the inner base pad portion, and the antipad has a radius that is equal to or substantially equal to a radius of a center hole in the coaxial connector.

The printed circuit board preferably further includes a slot. The slot preferably extends through the printed circuit board. The slot preferably has a radius that is equal to or substantially equal to the radius of the center hole in the coaxial connector.

The printed circuit board preferably further includes a second ground plane located on a layer nearest the top surface of the printed circuit board. The printed circuit board preferably further includes vias connecting the second ground plane to at least one of the base pad and the first ground plane. The second ground plane preferably includes an antipad under the pin pad.

A connector assembly according to a preferred embodiment of the present invention includes a connector as described above and a printed circuit board. The printed circuit board includes a base pad connected to the base of the connector, a pin pad connected to the center pin of the connector, a trace connected to the pin pad, and a first ground plane located on a top surface of the printed circuit board including an antipad that surrounds the pin pad and the trace. The antipad extends into an area defined by an inner perimeter of the base pad, and the antipad has a radius that is equal to or substantially equal to a radius of the center hole in the connector.

Preferably, the printed circuit board includes a slot, and the connector includes an extension that protrudes into the slot so that a bottom surface of the extension is below a top surface of the printed circuit board. The bottom surface of the extension is preferably below a bottom surface of the printed circuit.

The above and other features, elements, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
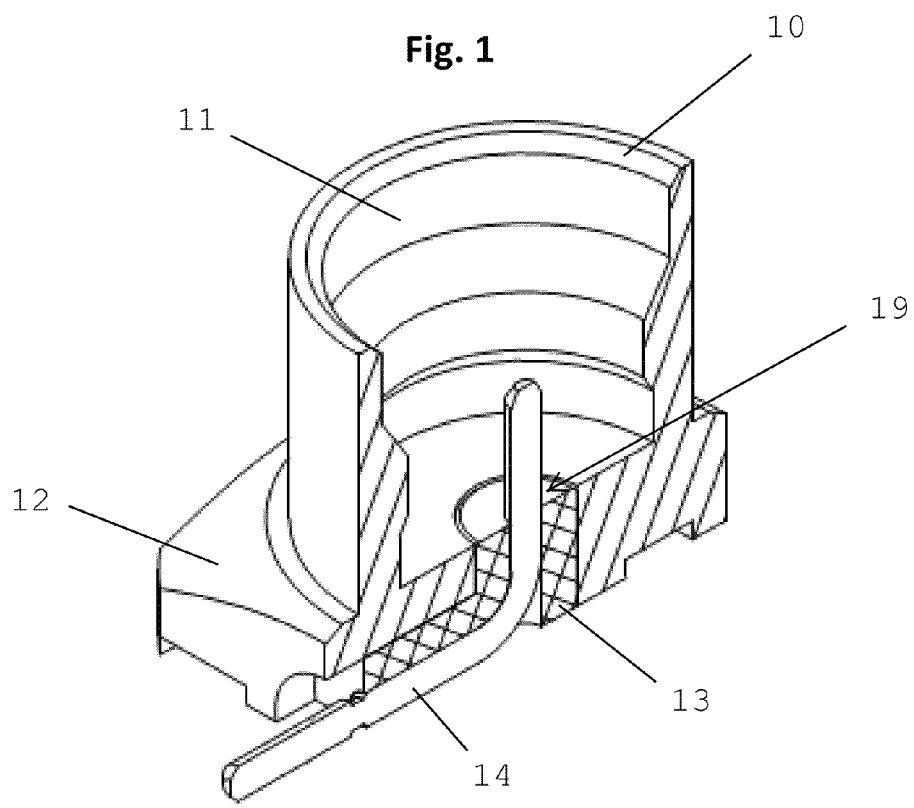
FIG. 1 is sectional perspective view of a connector according to a first preferred embodiment of the present invention.
Figure 2:
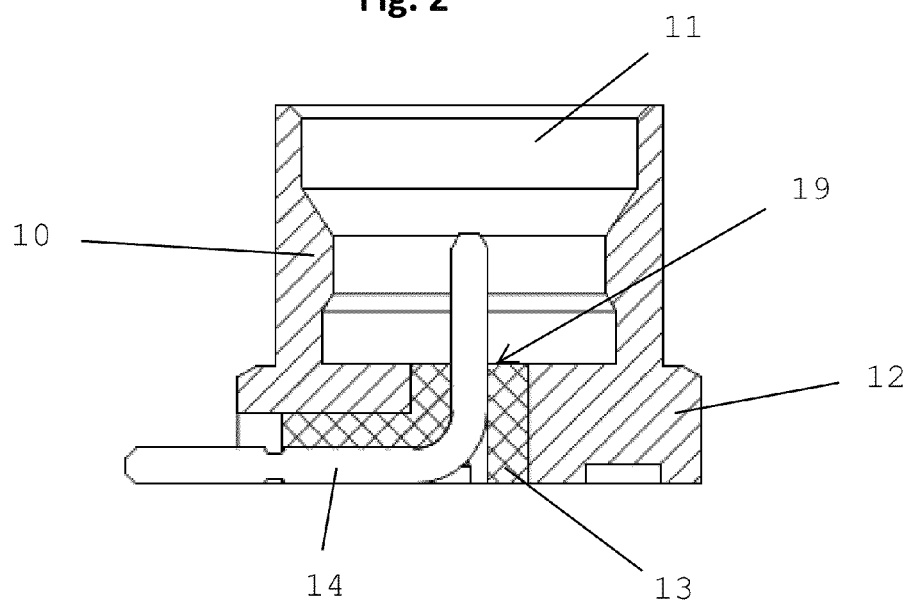
FIG. 2 is sectional side view of the connector of FIG. 1.
Figure 3:
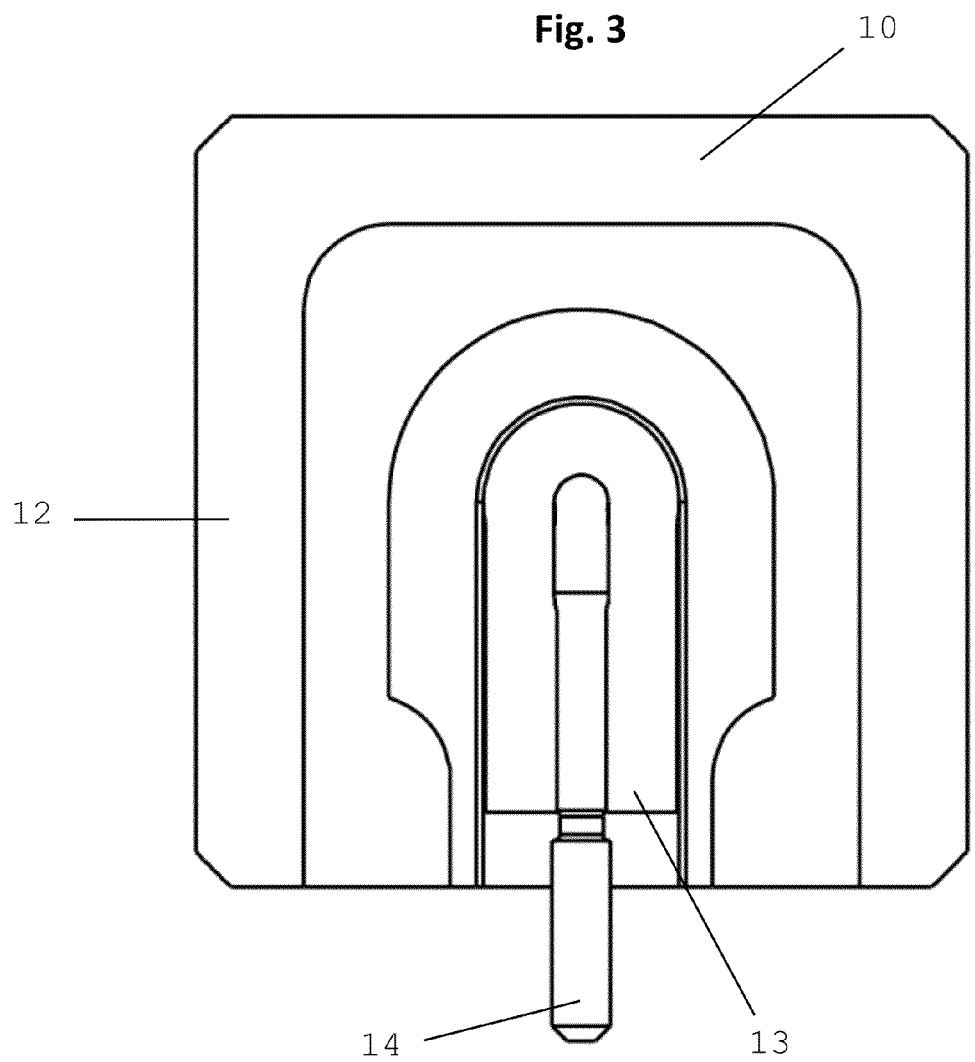
FIG. 3 is bottom view of the connector of FIG. 1.
Figure 4:
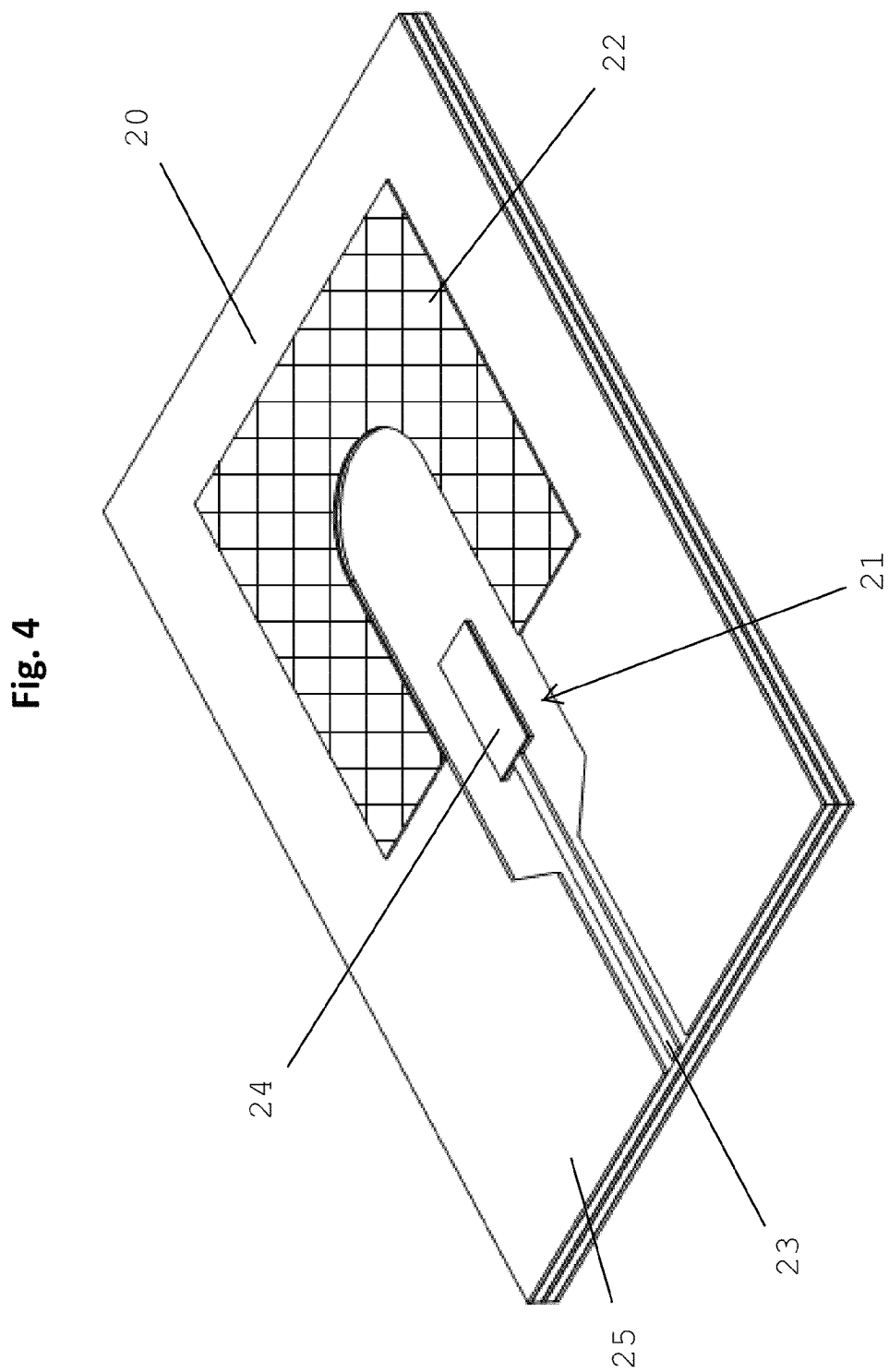
FIG. 4 is a perspective view a footprint according to second preferred embodiment of the present invention.
Figure 5:
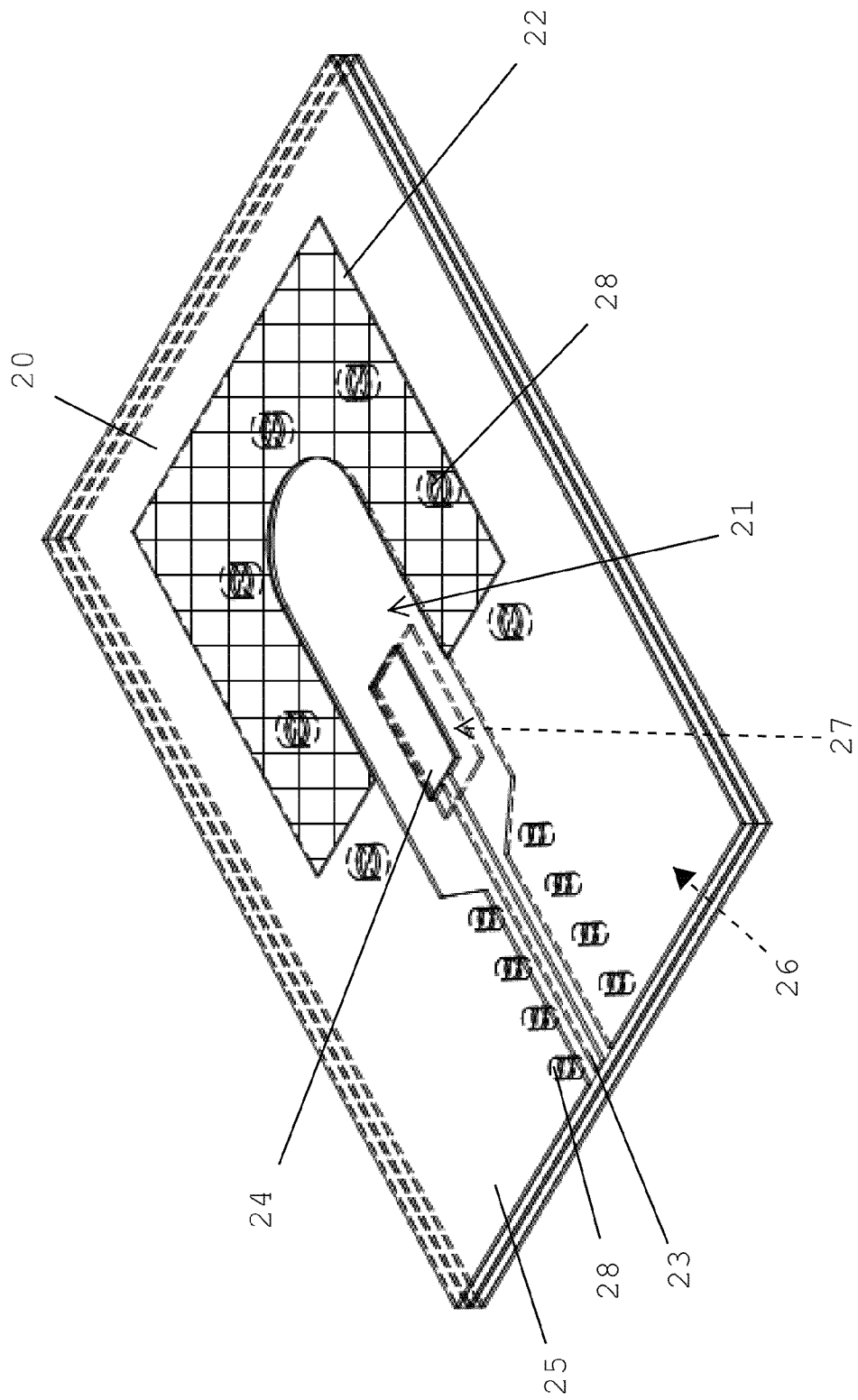
FIG. 5 is a see-through perspective view of the footprint of FIG. 4.
Figure 6:
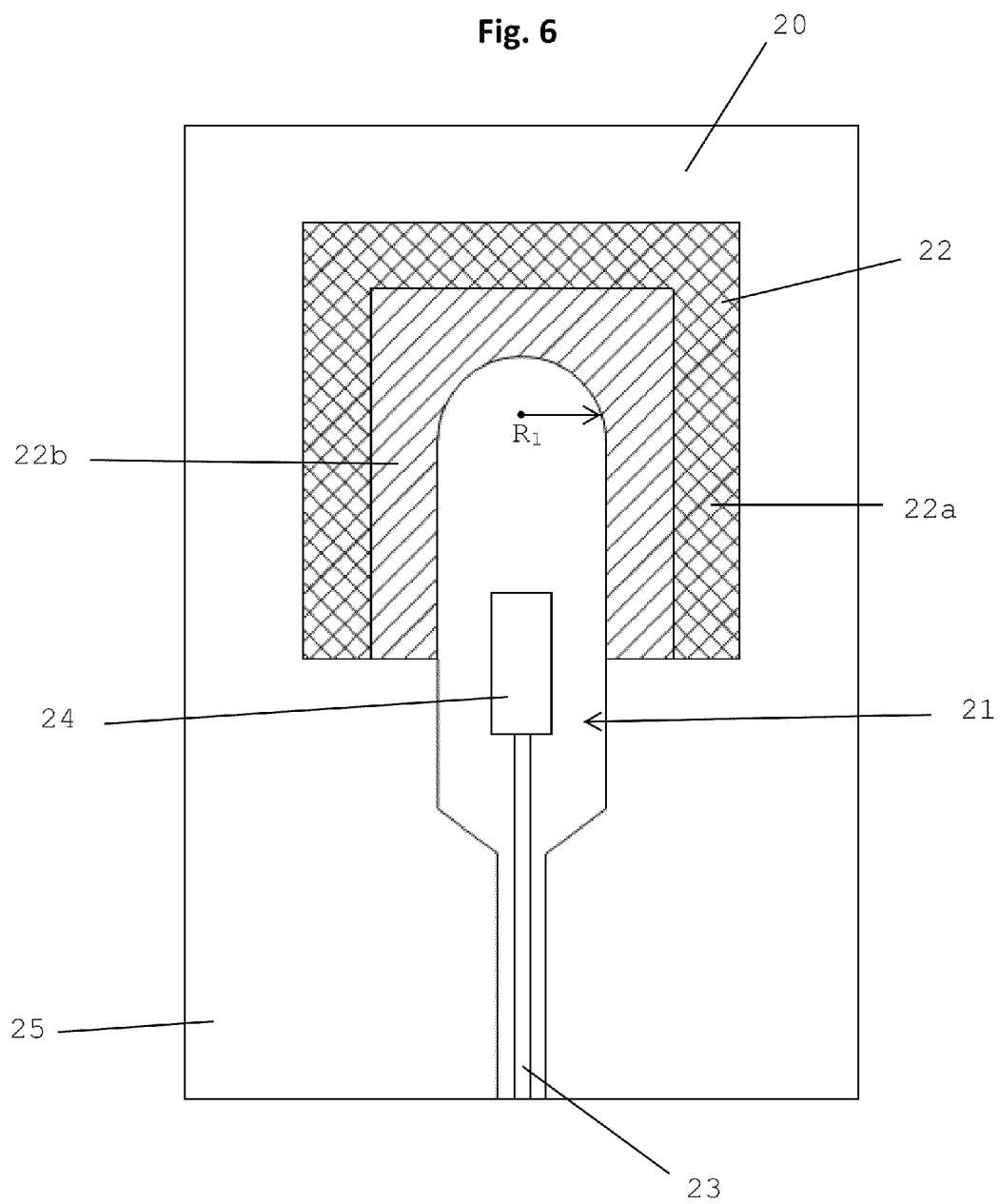
FIG. 6 is a top plan view of the footprint of FIG. 4.
Figure 7:
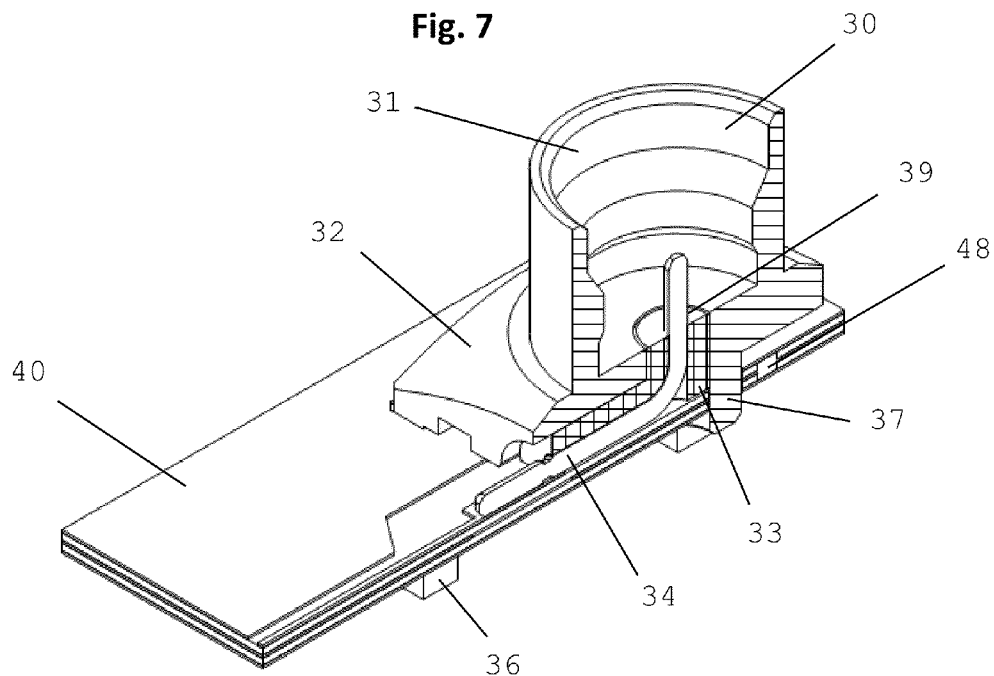
FIG. 7 is a sectional perspective view of a connector according to a third preferred embodiment of the present invention.
Figure 8:
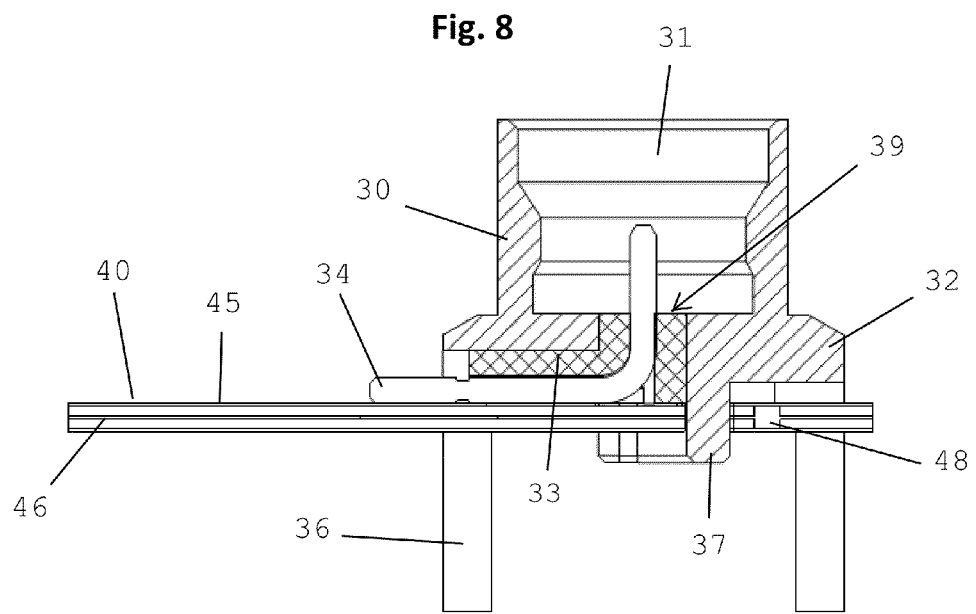
FIG. 8 is a sectional side view of the connector of FIG. 7.
Figure 9:
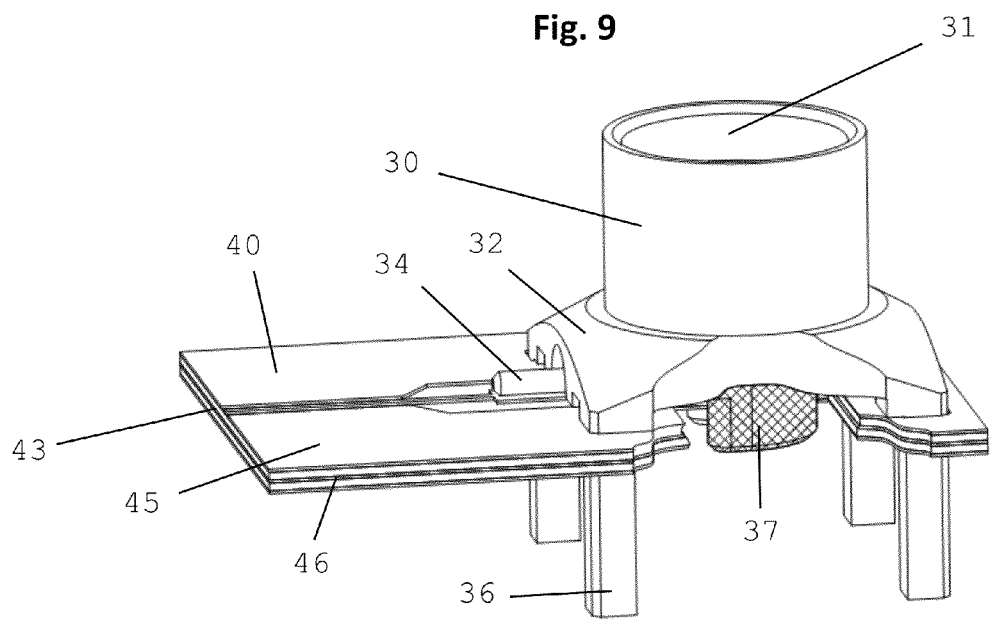
FIG. 9 is a partial-sectional side perspective view of the connector of FIG. 7.
Figure 10:
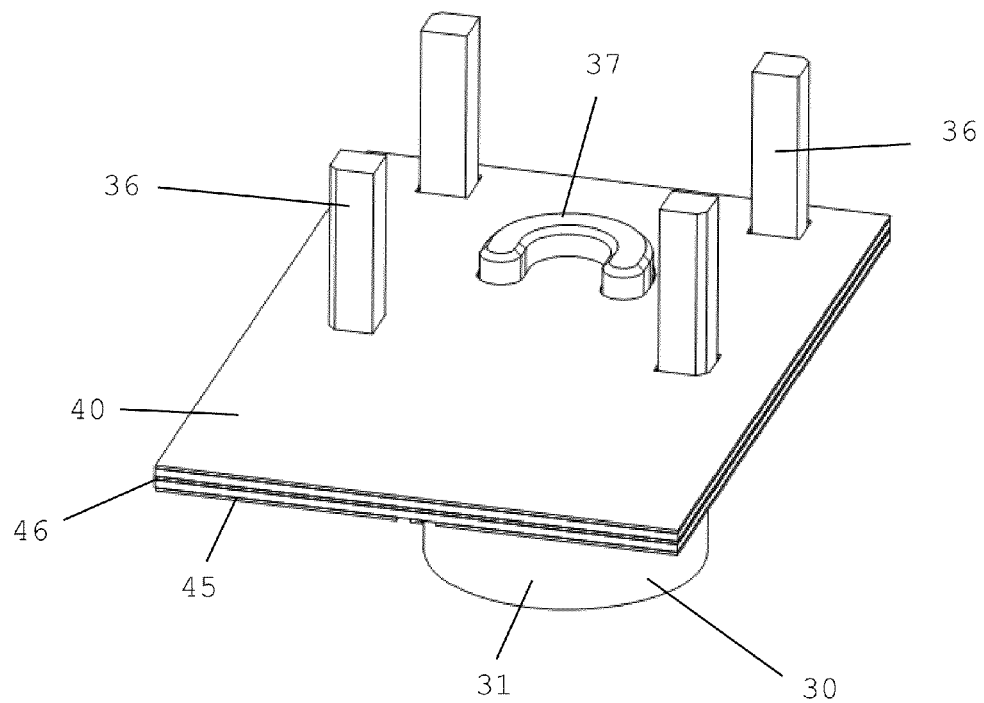
FIG. 10 is a bottom perspective view of the connector of FIG. 7.
Figure 11:
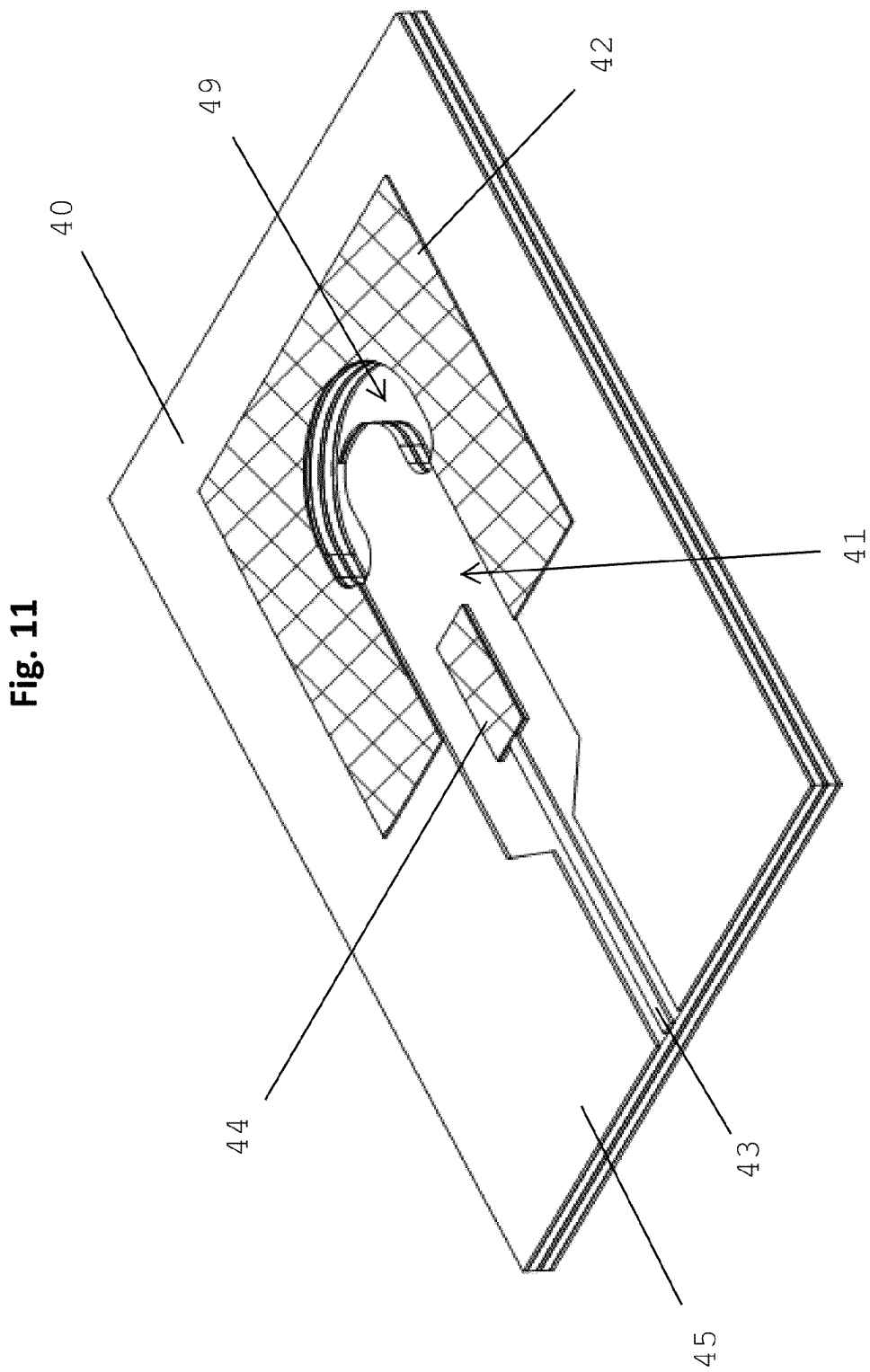
FIG. 11 is a perspective view a footprint according to fourth preferred embodiment of the present invention.
Figure 12:
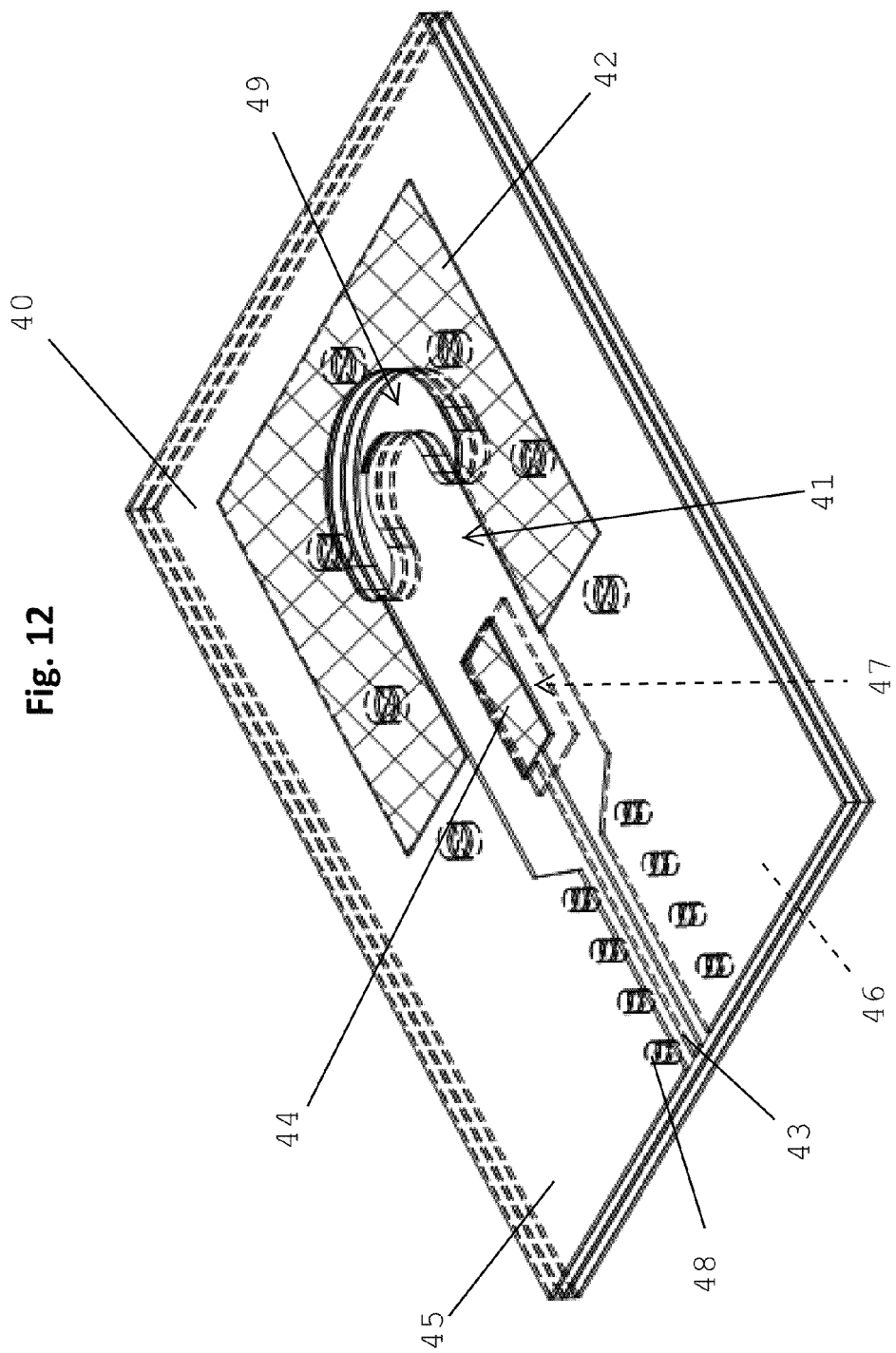
FIG. 12 is a see-through perspective view of the footprint of FIG. 11.
Figure 13:
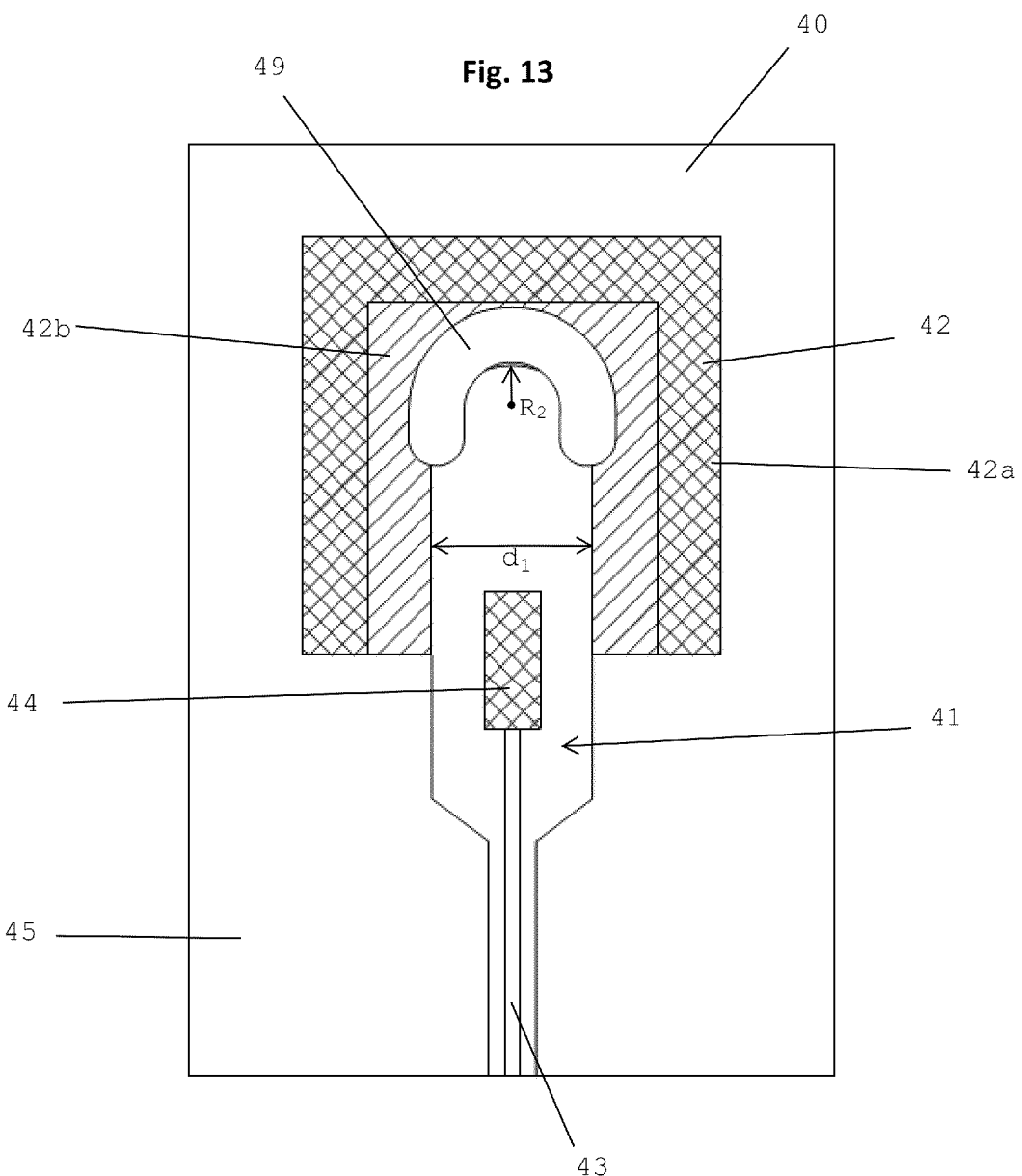
FIG. 13 is a top plan view of the footprint of FIG. 11.
Figure 14:
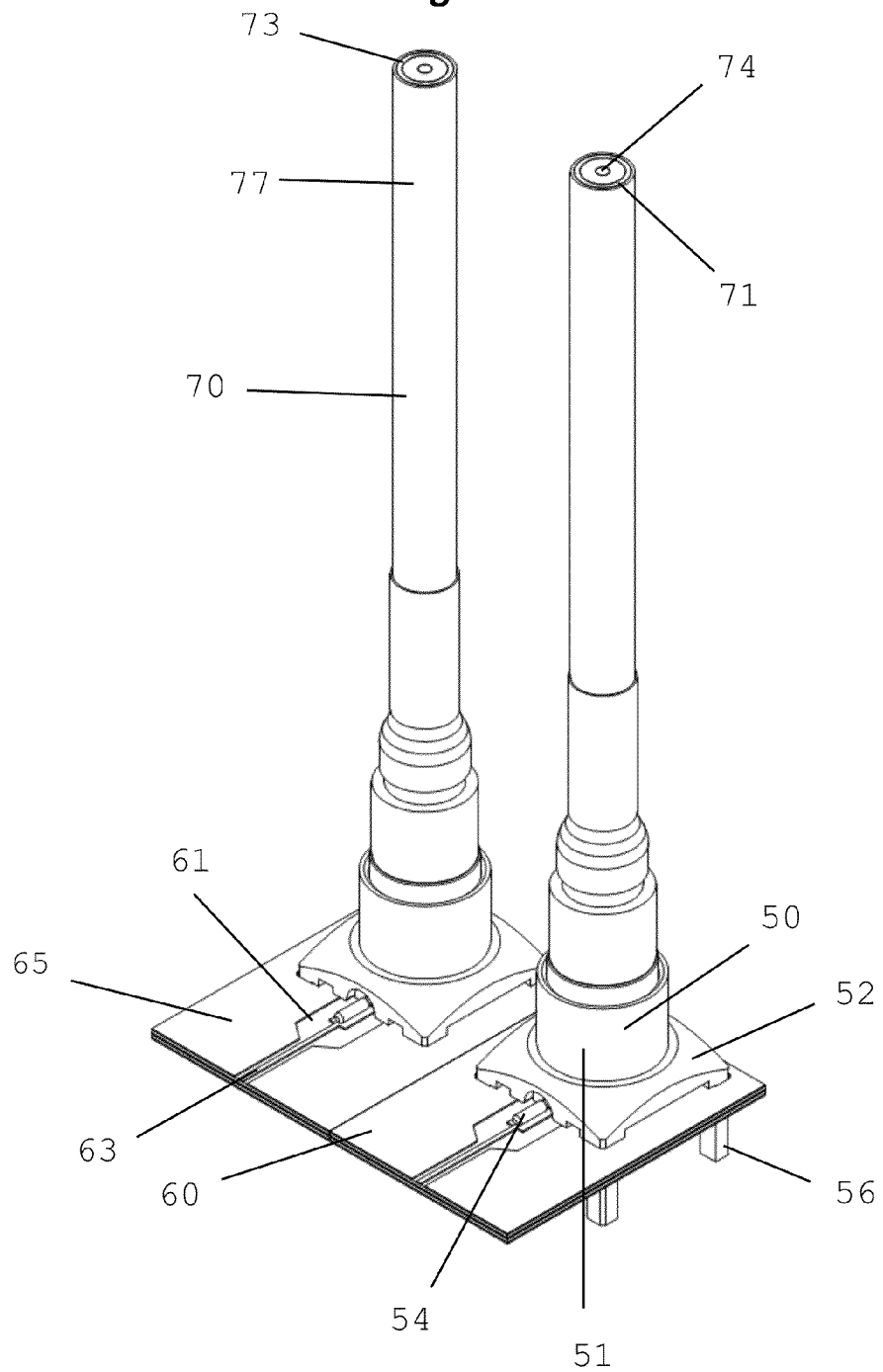
FIG. 14 is a perspective view of a pair of coaxial assemblies according to a fifth preferred embodiment of the present invention.
Figure 27:
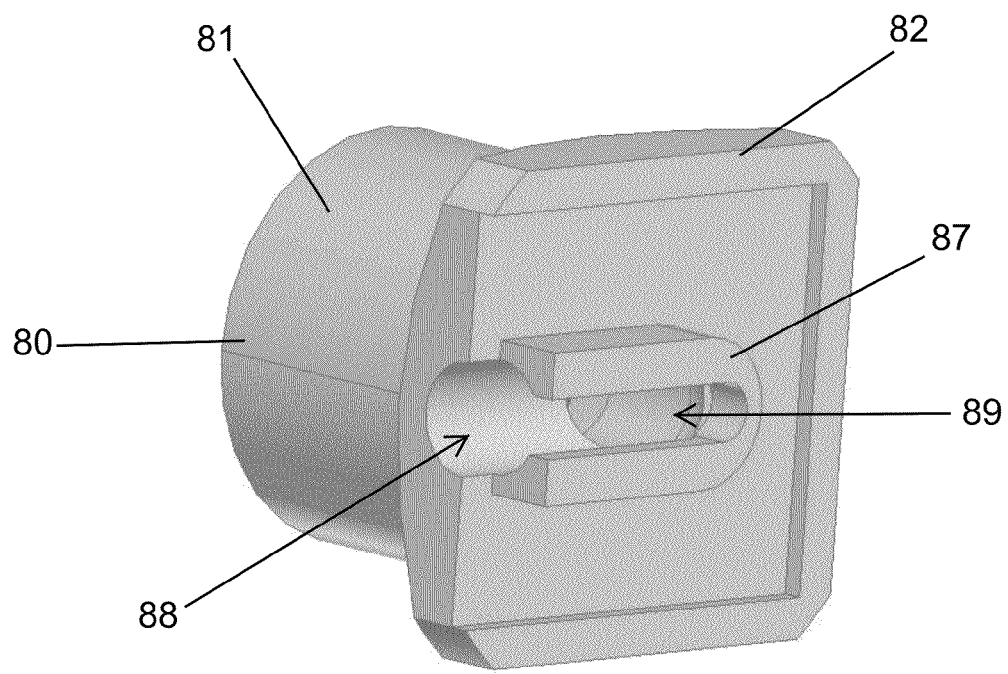
FIG. 27 is a bottom perspective view of a connector according to a sixth preferred embodiment of the present invention.
Figure 28:
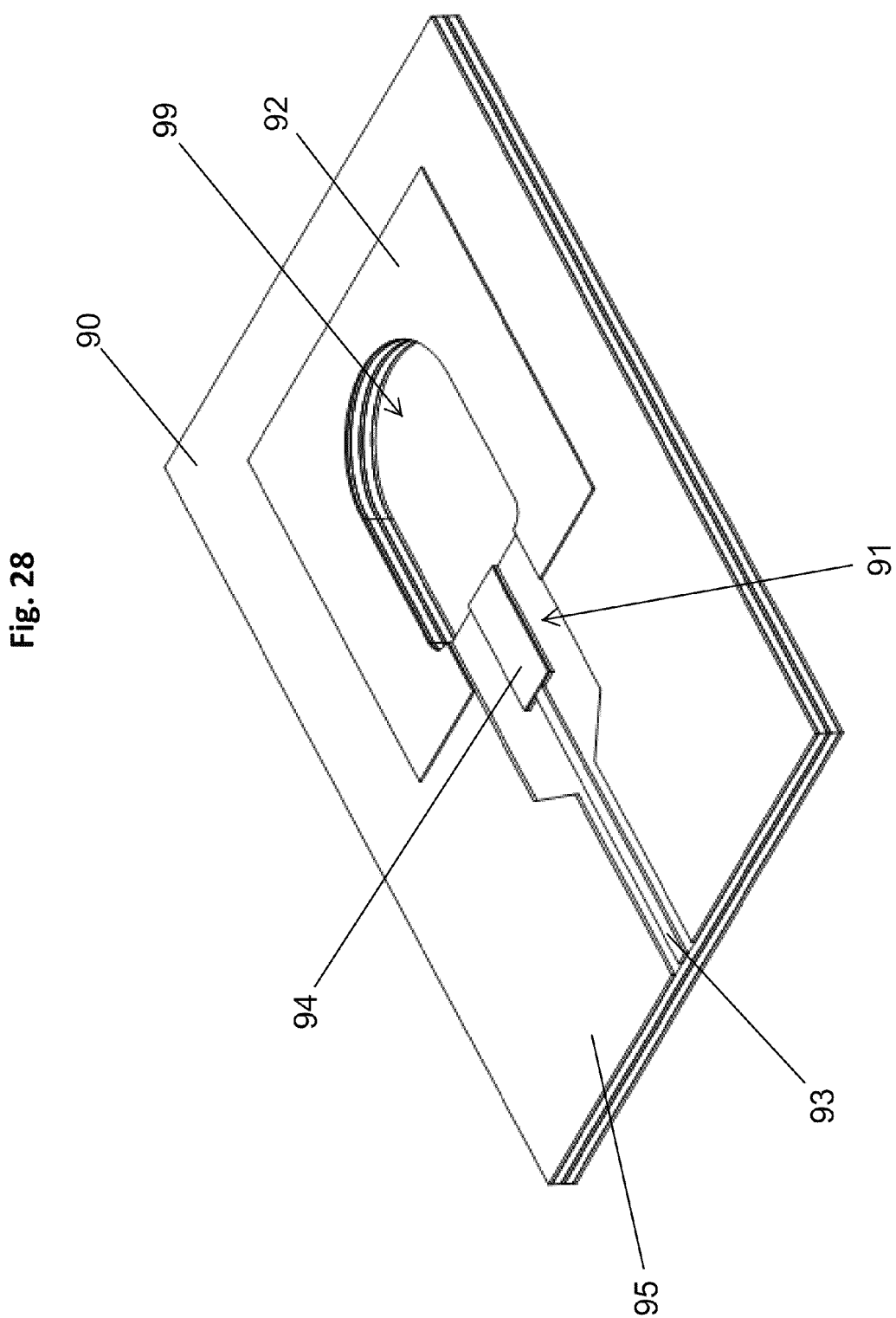
FIG. 28 is a perspective view a footprint according to a seventh preferred embodiment of the present invention.
Figure 29:
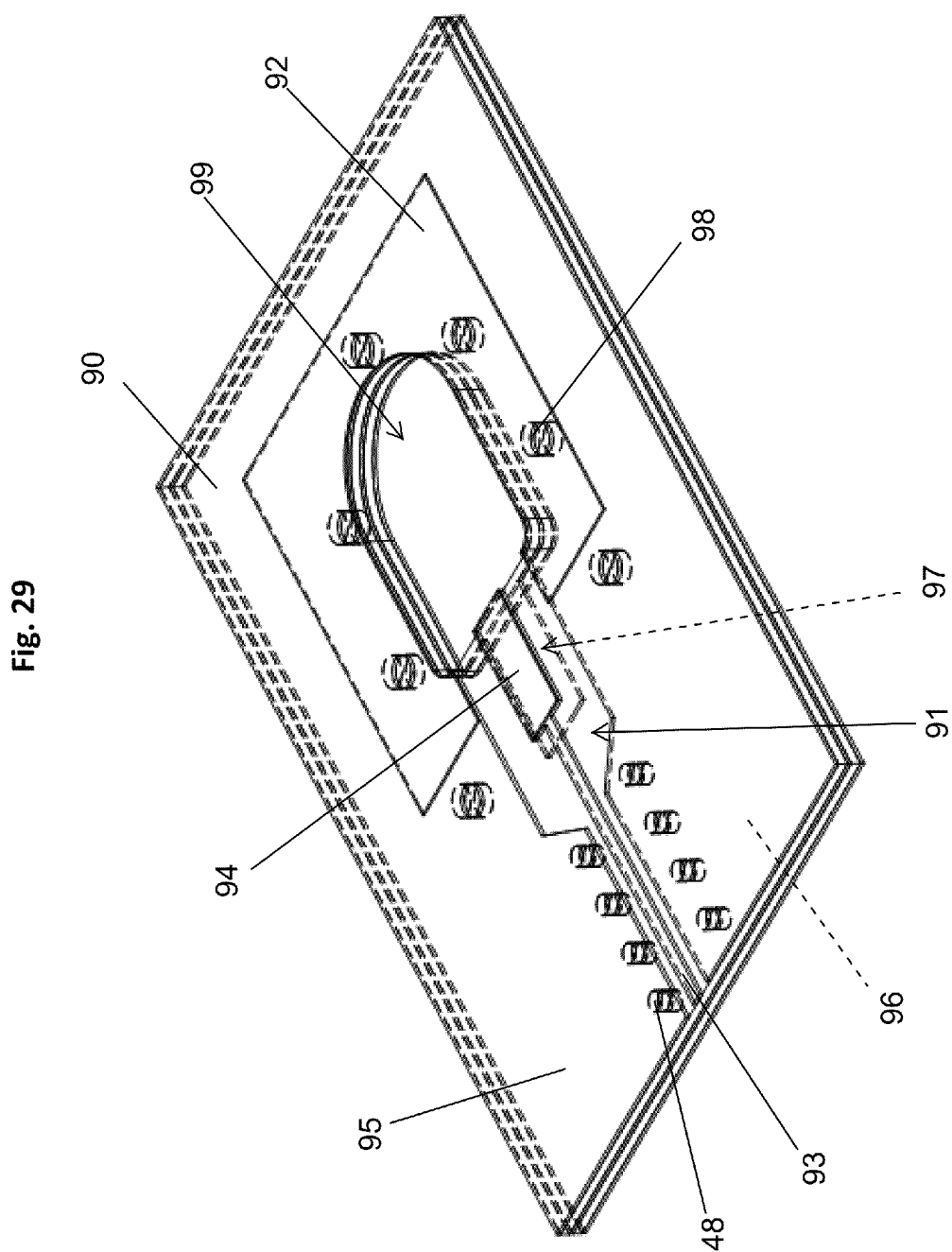
FIG. 29 is a see-through perspective view of the footprint of FIG. 28.
Figure 30:
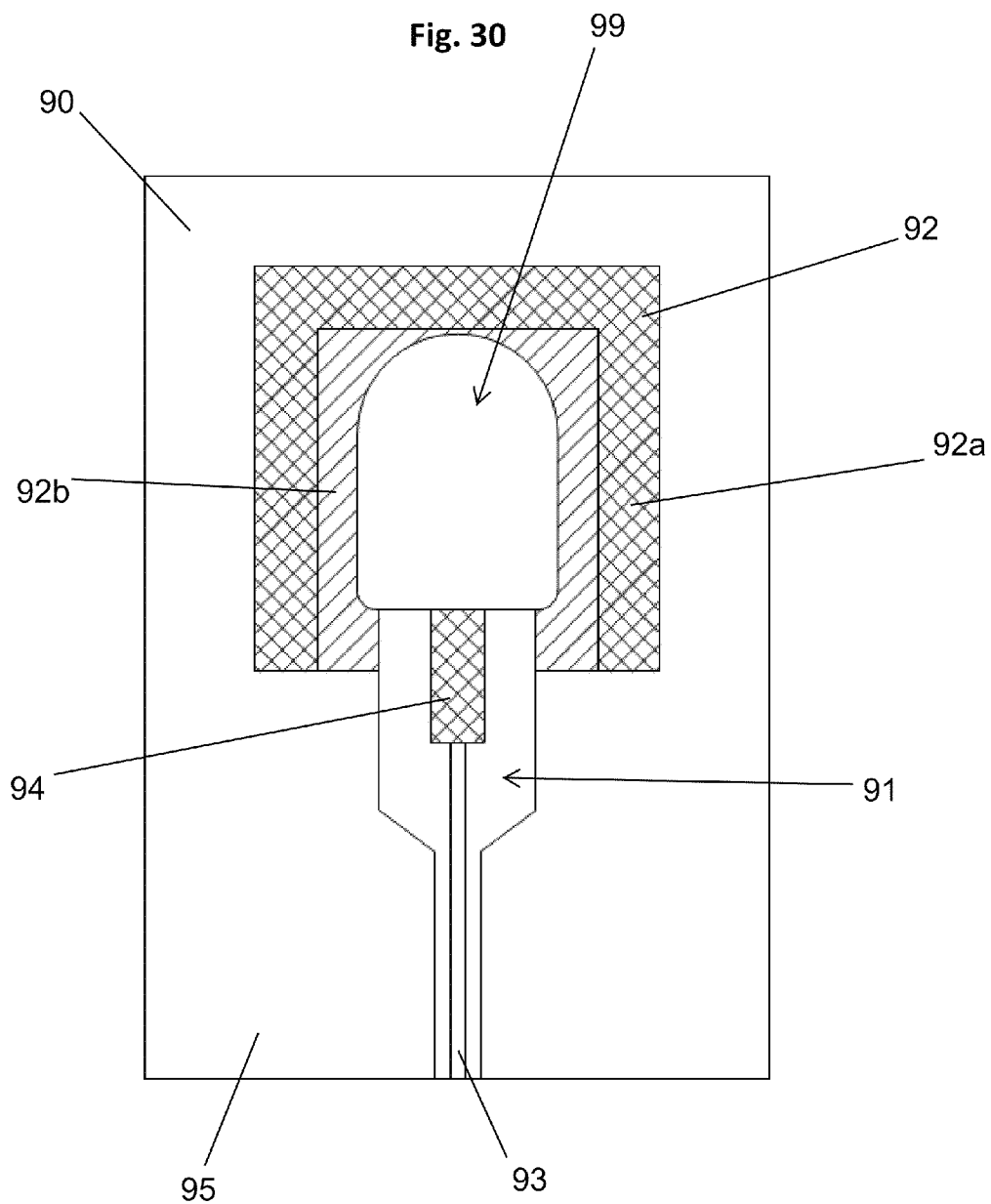
FIG. 30 is a top plan view of the footprint of FIG. 4.
Figure 31:
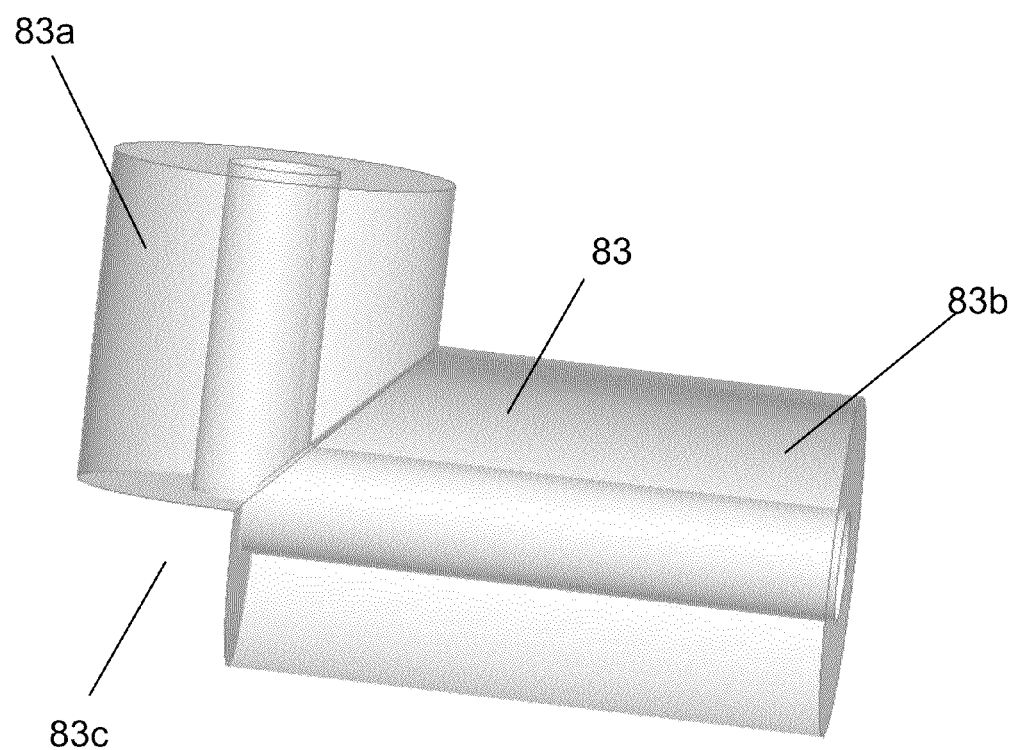
FIG. 31 is a side of a dielectric according to a preferred embodiment of the present invention.

FIGS. 1-14 and 27-31 show the various preferred embodiments of the present invention. FIGS. 1-3 show a connector 10 according to first preferred embodiment of the present invention. FIGS. 4-6 show a footprint according to a second preferred embodiment of the present invention that can be used with connector 10. FIGS. 7-10 show a connector 20 according to a third preferred embodiment of the present invention. FIGS. 11-13 show a footprint according to a fourth preferred embodiment of the present invention that can be used with connector 20. FIG. 14 shows a pair of coaxial assemblies according to a fifth preferred embodiment of the present invention. FIGS. 15-18 are graphs comparing the electrical characteristics of the assembly of the connector 100 and the known footprint of FIG. 22 with the assemblies of the connectors and footprints of various preferred embodiments of the present invention. FIG. 27 shows a connector 80 according to a sixth preferred embodiment of the present invention. FIGS. 28-30 show a footprint according to a seventh preferred embodiment of the present invention that can be used with connector 80. FIG. 31 shows dielectric according to a preferred embodiment of the present invention.

FIGS. 1-3 show a connector 10 according to a first preferred embodiment of the present invention. The connector 10 includes a housing 11 that mates with a corresponding connector of a coaxial cable (e.g., coaxial cable 70 of FIG. 14) and a base 12 that can be soldered to a PCB (e.g. PCB 20 of FIGS. 4-6). The connector 10 also includes a center pin 14 that connects with a center conductor (e.g., center conductor 74 of FIG. 14) of the coaxial cable and with a trace (e.g., trace 23 of FIGS. 4-6) on the PCB. Although connector 10 can be used with the coaxial cable 70 of FIG. 14 and the footprint of FIGS. 4-6, it is possible to connect the connector 10 to other cables and to mount the connector 10 to other footprints. The connection between the center conductor of the coaxial cable, the center pin 14 of the connector 10, and the trace of the PCB allows signals to be transmitted between the PCB and the coaxial cable. The connector 10 also includes a dielectric 13 arranged in the bottom of the base 12 that surrounds the center pin 14.

Figure 19:
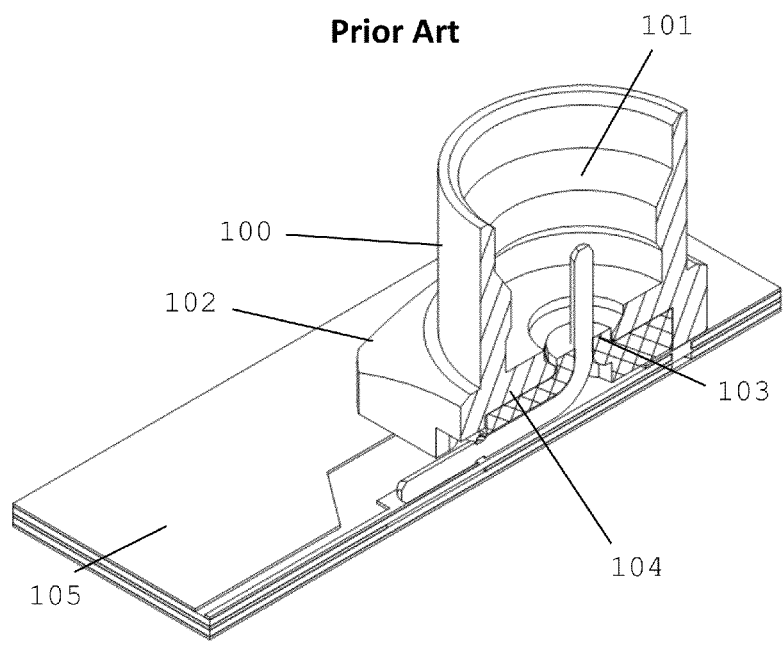
FIG. 19 is a sectional perspective view of a conventional connector.
Figure 20:
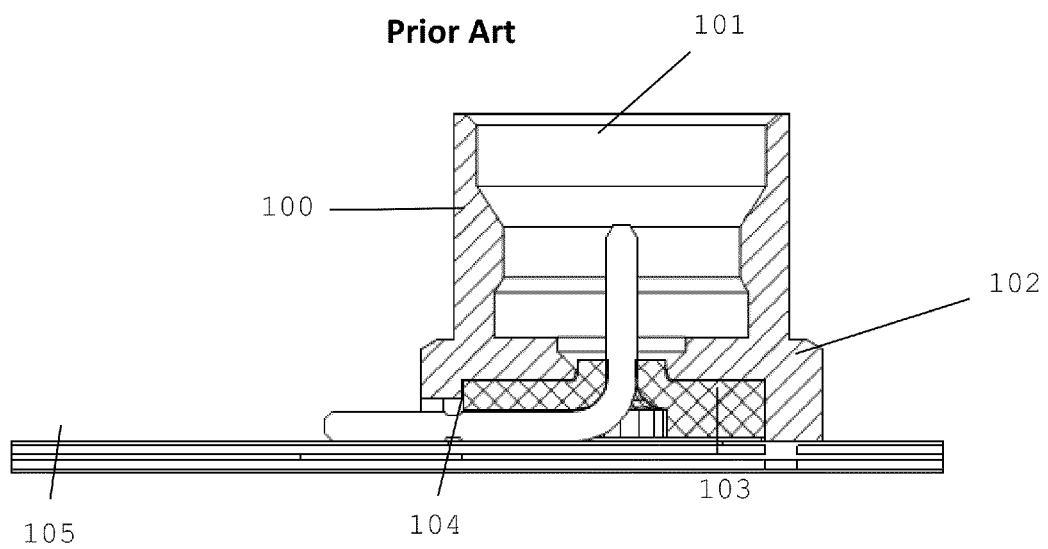
FIG. 20 is a sectional side view of the conventional connector of FIG. 19.
Figure 21:
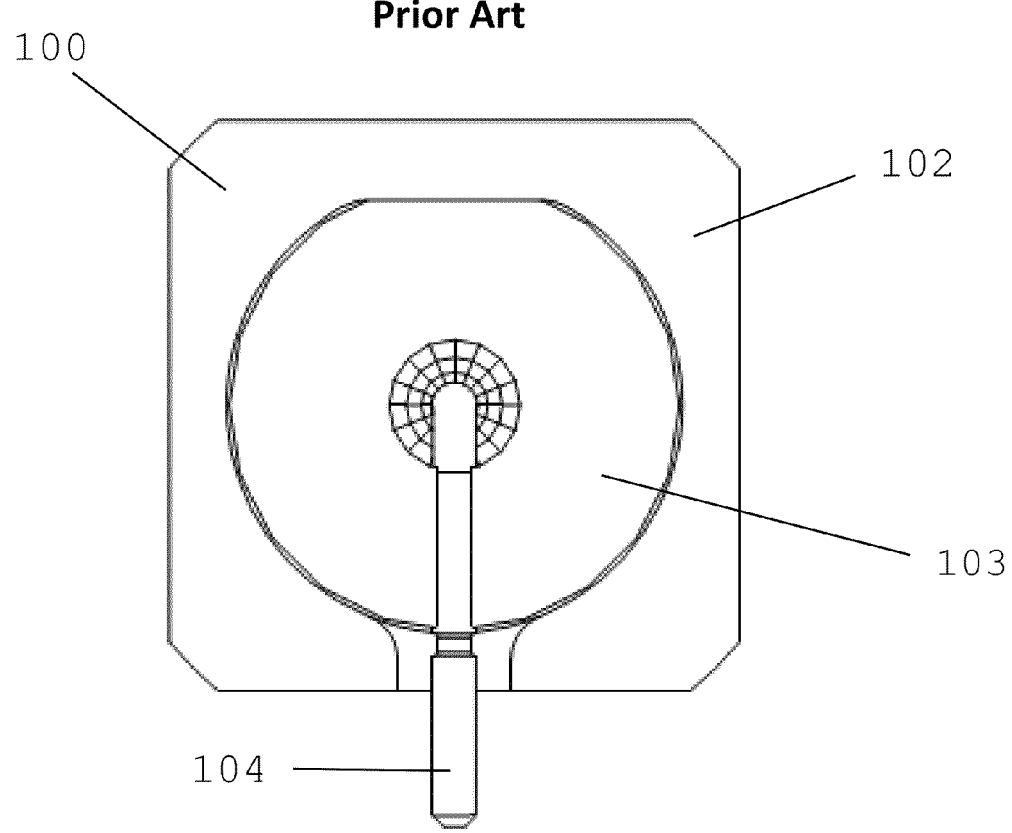
FIG. 21 is a bottom view of the conventional connector of FIG. 19.
Figure 26:
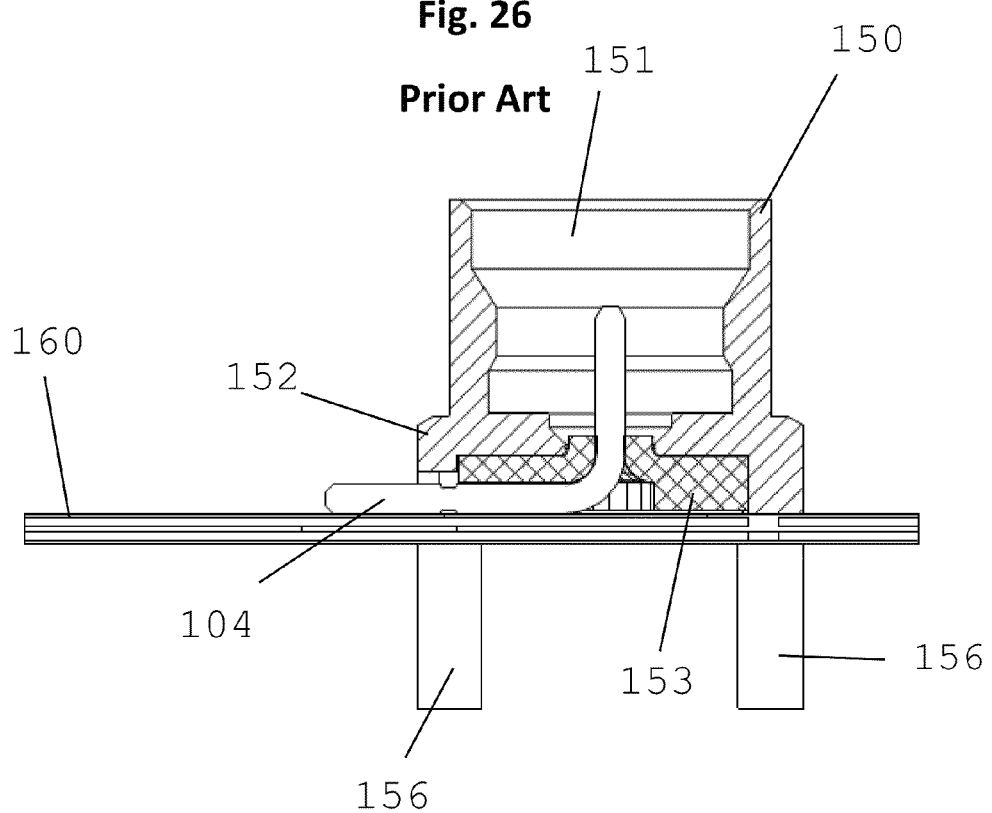
FIG. 26 is a sectional side view of another conventional connector.

The shape of the dielectric 13 is different from the known dielectric 103, 153 of FIGS. 19 and 26. Instead of having a disk shape like the known dielectrics 103, 154, dielectric 13 preferably has an L-shape with a first portion that has a hole through which the center pin 14 can extend and with a second portion that is perpendicular or substantially perpendicular within manufacturing tolerances to the first portion and that has a groove along which the center pin 14 can extend.

The corresponding portion of the connector 10 that surrounds the dielectric 13 and the center pin 14 is also different from those portions in the known connectors 100, 150 in that a groove in the base 12 provides a close conductive surface that signals transmitted through the center pin 14 can couple to, approximating a coaxial structure between the center pin 14 and the interior surface of the connector 10. In contrast, the connector 100, 150 does not maintain a near coaxial structure to the center pin 104, 154. The connector 10 includes a center hole 19 extending along a central axis of the connector 10. The first portion of the dielectric 13 is located within the center hole 19. The radius of the center hole 19 is such that the dielectric 13 can provide the same or substantially the same within manufacturing tolerances impedance as the impedance of the dielectric of the coaxial cable. This allows for the coaxial structure of the coaxial cable to extend into the connector 10. The connector 10 also includes a groove extending from the center hole 19 to the edge of the connector 10. The second portion of the dielectric is located within the groove. The groove preferably has a semicircular shape. The radius of the semicircular-shaped groove can be the same or substantially the same within manufacturing tolerances radius as the radius of the center hole 19. This allows for the coaxial structure of the coaxial cable to be approximated within the connector 10 parallel or substantially parallel to the surface of the PCB 20 where the PCB 20 approximates half of the coaxial structure.

The connector 10 more closely approximates the coaxial structure of the coaxial cable compared to the prior art because the geometry of the dielectric 13 more closely approximates the geometry of the dielectric of the coaxial cable by having approximately the same tube-like shape and because the closest interior surface of the connector 10 to the center pin 14 (which corresponds to the center conductor of the coaxial cable) is much closer to the center pin 14 than the closest interior surface of connectors 100, 150 is to the center pins 104, 154. Instead of the second portion of the dielectric 13 having a semicircular vertical cross-section, it is possible for the second portion of the dielectric 13 to have a circular vertical cross-section, which would require the center pin 14 to be bent to be soldered to the PCB 20.

Although not shown in the FIGS. 1-3, the connector 10 can also include legs similar to the legs 36 of FIGS. 7-10 that can be inserted into holes in a PCB to be grounded when the connector 10 is mounted to the PCB.

FIGS. 4-6 show PCB 20 with a footprint according to a second preferred embodiment of the present invention that can be used with the connector 10. The footprint includes a base pad 22 and a pin pad 24. The base 12 is soldered to the base pad 22, and the center pin 14 is soldered to the pin pad 24. The pin pad 24 is connected to a trace 23 that leads away from the pin pad 24. The footprint also includes a ground plane 25 that surrounds trace 23.

FIG. 5 is a see-through perspective view of the footprint of FIG. 4 in which structures within the PCB 20 are shown using broken lines. These structures cannot normally be seen. The PCB 20 preferably includes multiple layers. The layer nearest to the surface of the PCB 20 includes a ground plane 26. The ground plane 26 includes an antipad 27 underneath the pin pad 24. The ground plane 26 is connected to the ground plane 25 on the top of the PCB 110 by vias 28. The reference lines for ground plane 26 and antipad 27 are broken to show that the ground plane 26 and the antipad 27 is within the PCB 20.

Figure 24:
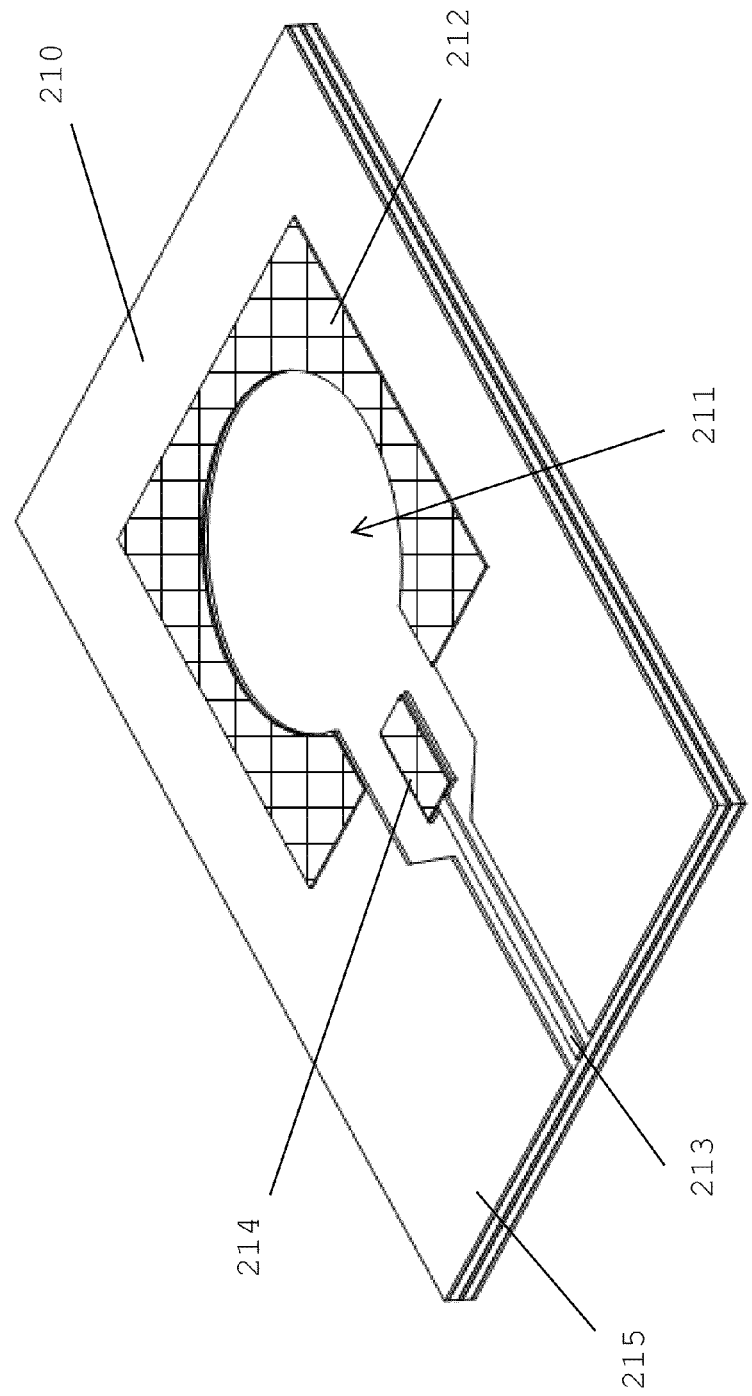
FIG. 24 is a perspective view of another known footprint.
Figure 25:
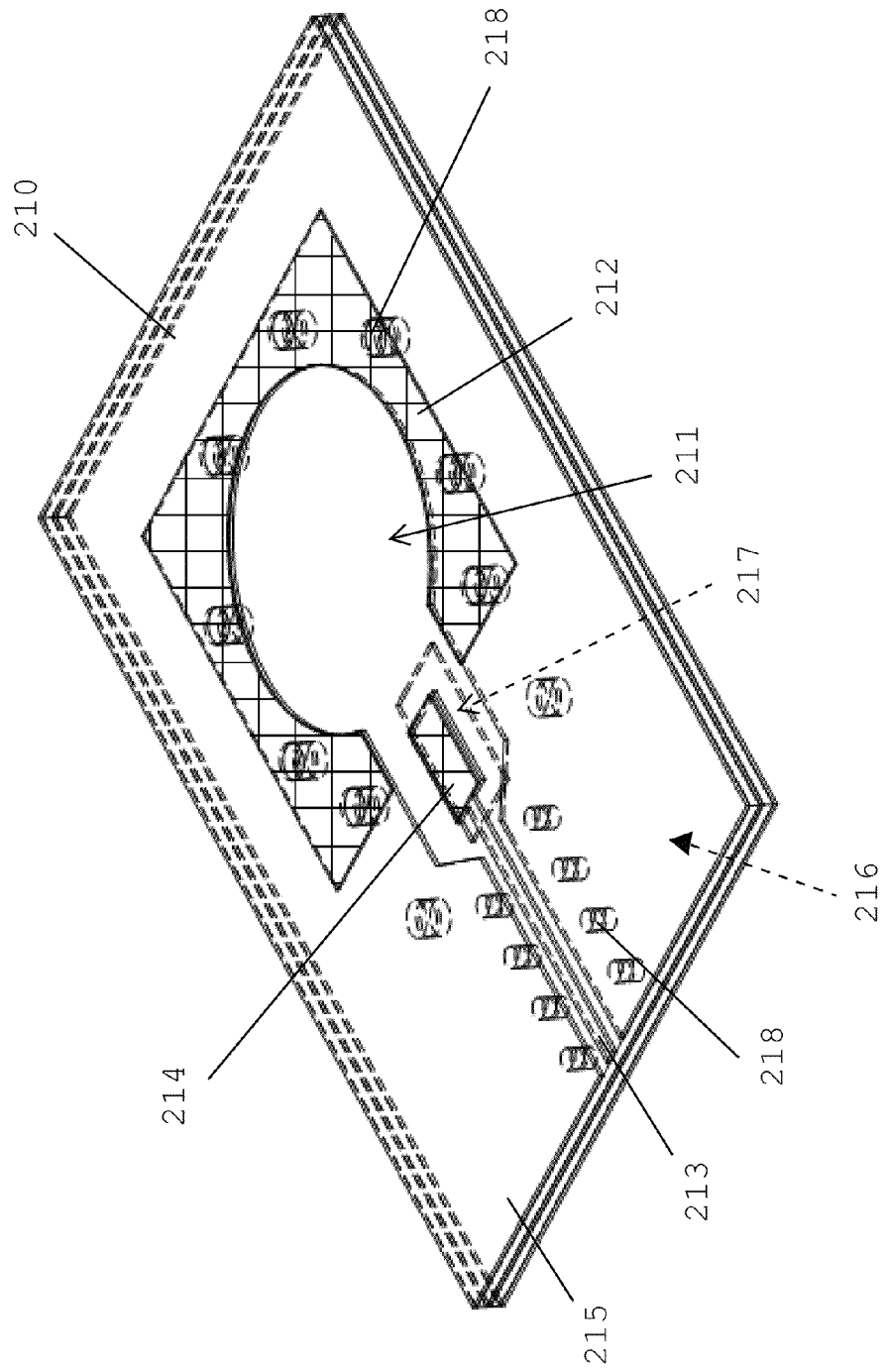
FIG. 25 is a see-through perspective view of the known footprint of FIG. 24.

As shown in FIG. 6, the base pad 22 includes an outer base pad 22a and an inner base pad 22b. The outer base pad 22a is similar to the known base pad 112 of FIG. 22 in that both have a rectangular U-shape with sharp corners. However, the footprint of FIG. 6 is different from the footprints of FIGS. 22 and 24 because of the inner base pad 22b. The inner base pad 22b encompasses a greater interior area in the area defined by the perimeter of the base pad 22 compared to the known base pads 112, 212 of FIGS. 22 and 24. The base pad 22 more closely approximates a coaxial structure because the distance between the interior perimeter of the inner base pad 22b and a center pin 14 when the connector 10 is mounted to the footprint is much smaller than the distance between the interior perimeter of the base pad 112, 212 and the center pin 104, 154.

The cutout 21 within the perimeter of the base pad 24 preferably has a semi-circular shape or U-shape. The length of the radius $R_1$ of the cutout 21 is preferably the same or substantially the same within manufacturing tolerances as the radius of the center hole 19 through which the center pin 14 extends. Having the radius $R_1$ be the same as the radius of the center hole 19 allows the coaxial structure of the connector 10 to be extended to the PCB 10.

Preferably, in the inner base pad 22b is covered with a mask so that solder does not adhere to the inner base pad 22b. Because the inner base pad 22b is so close to the pin pad 24, there is a chance that, during a reflow process, the solder will form an electrical connection between the inner base pad 22b and the pin pad 24, short circuiting the pin pad 24 and the inner base pad 22b. By providing a mask on the inner base pad 22b, it is possible to reduce the chance that the solder will short circuit the inner base pad 22b and pin pad 22b.

FIGS. 7-10 show a connector 30 according to a third preferred embodiment of the present invention. The connector 30 includes a housing 31 that mates with a corresponding connector of a coaxial cable (e.g., coaxial cable 70 of FIG. 14) and a base 32 that can be soldered to PCB 40. The connector 30 also includes a center pin 34 that connects with a center conductor (e.g., center conductor 74 of FIG. 14) of the coaxial cable and with a trace 43 on the PCB 40. Although connector 30 can be used with the coaxial cable 70 of FIG. 14 and the footprint of FIGS. 11-13, it is possible to connect the connector 30 to other cables and to mount the connector 30 to other footprints. The connection between the center conductor of the coaxial cable, the center pin 34 of the connector 30, and the trace 43 of the PCB 40 allows signals to be transmitted between the PCB 40 and the coaxial cable. The connector 30 also includes a dielectric 33 arranged in the bottom of the base 32 that surrounds the center pin 34.

The shape of the dielectric 33 is preferably the same as the shape of the dielectric 13. Dielectric 33 preferably has an L-shape with a first portion that has a hole through which the center pin 34 can extend and with a second portion that is perpendicular or substantially perpendicular within manufacturing tolerances to the first portion and that has a groove along which the center pin 34 can extend. Instead of the second portion of the dielectric 33 having a semicircular vertical cross-section, it is possible for the second portion of the dielectric 33 to have a circular vertical cross-section, which would require the center pin 34 to be bent to be soldered to the PCB 40.

As with the connector 10, connector 30 includes a groove in the base 32 that provides a close conductive surface that signals transmitted through the center pin 34 can couple to, approximating a coaxial structure between the center pin 34 and the interior surface of the connector 30. The connector 30 includes a center hole 39 extending along a central axis of the connector 30. The first portion of the dielectric 33 is located within the center hole 39. The radius of the center hole 39 is such that the dielectric 33 can provide the same or substantially the same within manufacturing tolerances impedance as the impedance as the dielectric of the coaxial cable. This allows for the coaxial structure of the coaxial cable to extend into the connector 30. The connector 30 also includes a groove extending from the center hole 39 to the edge of the connector 30. The second portion of the dielectric is located within the groove. The groove preferably has a semicircular shape. The radius of the semicircular-shaped groove can have the same or substantially the same radius within manufacturing tolerances as the radius of the center hole 39. This allows for the coaxial structure of the coaxial cable to be approximated within the connector 30 parallel or substantially parallel to the surface of the PCB 40 where the PCB 40 approximates half of the coaxial structure.

The connector 30 more closely approximates the coaxial structure of the coaxial cable compared to the prior art because the geometry of the dielectric 33 more closely approximates the geometry of the dielectric of the coaxial cable by having approximately the same tube-like shape and because the closest interior surface of the connector 30 to the center pin 34 (which corresponds to the center conductor of the coaxial cable) is much closer to the center pin 34 than the closest interior surface of connectors 100, 150 is to the center pins 104, 154. Instead of the second portion of the dielectric 33 having a semicircular vertical cross-section, it is possible for the second portion of the dielectric 33 to have a circular vertical cross-section, which would require the center pin 34 to be bent and to be soldered to the PCB 40.

Connector 30 preferably includes legs 37 that are inserted into holes in the PCB 40 when the connector 30 is mounted to the PCB 40. Legs 37 can be used to ground the connector 30 to the PCB 40. It is also possible for the connector 30 not to include legs 37, similar to the connector 10 of FIGS. 1-3.

The connector 30 differs from the connector 10 in that the connector 30 includes an extension 37 that extends from the bottom of the connector 30 such that the extension 37 extends into a slot 49 in the PCB 40 when the connector 30 is mounted to the PCB 40. FIG. 9 is a partial sectional perspective view showing the extension 37 extending from the connector 30. The extension 37 does not need to be soldered to the PCB 40. The bottom of the extension 37 is preferably below the top surface of the PCB 40 and can be below the bottom surface of the PCB 40 as shown in FIG. 10 but does not have to be.

The extension 37 is preferably semi-circular-shaped or U-shaped; however, other suitable shapes could be used. For example, the extension 37 could be circular but less than semi-circular. The extension 37 preferably includes a radius whose length is the same or substantially the same within manufacturing tolerances of the length of the radius of the center hole 39 through which the center pin 34 extends. Having the radius of the extension 37 be the same as the radius of the center hole of the connector 30 allows the coaxial structure of the connector 30 to be extended to and through the PCB 10. The extension 37 can have any suitable thickness.

The extension 37 provides a three-dimensional interface between the connector 30 and the PCB 40, which improves the coaxial structure for signals transmitted between connector 30 and the PCB 40. The extension 37 replaces the discrete structure provided by the vias 118, 218 with a continuous structure, which improves the coaxial structure for signals transmitted through the connector 30. Although the extension 37 is preferably continuous, it is also possible to divide the extension 37 into discrete portions. The extension 37 provides a conductive surface below the top surface of PCB 40 without having to provide any structures within the PCB 40. To provide a continuous conductive surface below the top surface of PCB 40 without using the extension 37 would require soldering, which would be difficult, if not impossible, to perform so close to the pin pad 44. The exact structure of the extension 37 can be more precisely controlled than using structures on and within the PCB 40 (e.g., ground planes 45, 46 and vias 48) because the casting and machining processes used to make the extension 37 are more precise than drilling, etching, and plating processes used to make the structures on and within the PCB 40.

FIGS. 11-13 show PCB 40 with a footprint according to a fourth preferred embodiment of the present invention that can be used with the connector 30. The footprint includes a base pad 42 and a pin pad 44. The base 32 is soldered to the base pad 42, and the center pin 34 is soldered to the pin pad 44. The pin pad 44 is connected to a trace 43 that leads away from the pin pad 44. The footprint also includes a ground plane 45 that surrounds the trace 43.

FIG. 12 is a see-through perspective view of the footprint of FIG. 11 in which structures within the PCB 40 are shown using broken lines. These structures cannot normally be seen. The PCB 40 preferably includes multiple layers. The layer nearest to the surface of the PCB 40 includes a ground plane 46. The ground plane 46 includes an antipad 47 underneath the pin pad 44. The ground plane 46 is connected to the ground plane 25 on the top of the PCB 40 by vias 48. The reference lines for ground plane 46 and antipad 47 are broken to show that the ground plane 46 and the antipad 47 are within the PCB 40.

As shown in FIG. 13, the base pad 42 is similar to the base pad 22 in that base pad 42 includes an outer base pad 42a and an inner base pad 42b. The base pad 42 more closely approximates a coaxial structure because of the close distance between the interior perimeter of the inner base pad 42b and a center pin 34 when the connector 30 is mounted to the footprint.

The footprint of FIG. 11 is different from the footprint of FIG. 4 in that the footprint of FIG. 11 includes slot 49 through which the extension 37 can be inserted. The slot 49 preferably extends all the way through the PCB 40. However, it is possible the slot 49 is a groove in the PCB 40 that does not extend all the way through the PCB 40. If the slot 49 is a groove, then the height of the extension 37 will be less than the depth of the slot 49. The slot 49 is preferably precision-machined in the PCB 40.

The cutout 41 within the perimeter of the base pad 44 preferably has a semi-circular shape or U-shape defined by the slot 49. The length of the radius $R_2$ of the antipad 41 is preferably the same or substantially the same within manufacturing tolerances as the radius of the center hole 39 of the connector 30 through which the center pin 34 extends. This allows the extension 37 of the connector 30 to extend into and possibly below the PCB 40, and because the radius $R_2$ is the same or substantially the same within manufacturing tolerances as the radius of the center hole 39, the coaxial structure of the connector 30 can be extended to and through the PCB 40.

The width $d_1$ of cutout 41 within the perimeter of the base pad 44 is preferably approximately equal to or greater than twice the radius $R_2$. If the width $d_1$ is approximately equal to twice the radius $R_2$, then the cutout 41 has a shape similar to the cutout 21 of FIG. 6. If the width $d_1$ is more than twice the radius R₂, then the cutout 41 has the shape of FIG. 6 with a narrowed portion with radius R₂. It is preferable that the width d₁ is approximately equal to twice the radius R₂ so that the horizontal coaxial structure along the surface of the PCB 40 matches the vertical coaxial structure through center hole 39. That is, if the width d₁ is approximately equal to twice the radius R₂, then the vertical cross-section of the horizontal cavity along the surface of the PCB 40 matches the horizontal cross-section of the vertical cavity through the center hole 39.

Preferably, as with inner base pad 22*b*, the inner base pad 42*b* is covered with a mask so that solder does not adhere to the inner base pad 42*b* to reduce the chance that the solder will short circuit the inner base pad 42*b* and pin pad 44.

FIG. 14 shows a fifth embodiment of the present invention in which two coaxial cable assemblies include cables 70 mated to two connectors 50 on PCB 60. Each coaxial cable 70 includes a center conductor 74 that is surrounded by a dielectric 73 that is surrounded by a shield 71 that is surrounded by an outer sheath. PCB 60 includes traces 63 and ground planes 65 that have an antipad 61 that surrounds the traces 63. Each connector 50 includes housing 51 and base 52. The base 52 preferably includes legs 56 that extend through the PCB 60 and that are grounded to the PCB 60. Each connector 50 also includes a center pin 54 that is connected to pin pad connected to the trace 63. Although two coaxial cable assemblies are shown in FIG. 14, any number of coaxial cable assemblies can be used.

FIG. 27 show a connector 80 according to a sixth preferred embodiment of the present invention. The connector 80 includes a housing 81 that mates with a corresponding connector of a coaxial cable (e.g., coaxial cable 70 of FIG. 14) and a base 82 that can be soldered to PCB 90. The connector 80 also includes a center pin (not shown) that connects with a center conductor (e.g., center conductor 74 of FIG. 14) of the coaxial cable and with a trace 93 on the PCB 90. Although connector 80 can be used with the coaxial cable 70 of FIG. 14 and the footprint of FIGS. 28-30, it is possible to connect the connector 80 to other cables and to mount the connector 80 to other footprints. The connection between the center conductor of the coaxial cable, the center pin of the connector 80, and the trace 93 of the PCB 90 allows signals to be transmitted between the PCB 90 and the coaxial cable. The connector 80 also includes a dielectric 83 (shown in FIG. 31) arranged in the bottom of the base 82 that surrounds the center pin.

The shape of the dielectric 83 is preferably similar to the shape of the dielectric 13, 33, having an L-shape with a hole through which the center pin can extend. The dielectric has first 83*a* and second 83*b* portion that are perpendicular or substantially perpendicular within manufacturing tolerances to each other. The first 83*a* and second 83*b* portions have a circular vertical cross-section. If the connector 80 is used with the footprint shown in FIGS. 28-30, it is not required to bend the center pin 34. As shown in FIG. 31, the first 83*a* and second 83*b* portions are discrete components. The first portion 83*a* can be inserted in the center hole 89 from the top of the connector 80, and the second portion 83*b* can be inserted into the groove 88 and the extension 87 from the side of the connector 80. The dielectric preferably includes a notch 83*c* at the corner of the dielectric 83 that improves the signal transmission through the dielectric.

As with the connectors 10, 30, connector 80 includes a groove 88 in the base 82 that provides a close top conductive surface that signals transmitted through the center pin can couple to. A difference between connectors 10, 30 and connector 80 is that the extension 87 of connector 80 extends along the groove 80, proving a close bottom conductive surface that signals transmitted through the center pin can couple to.

The connector 80 includes a center hole 89 extending along a central axis of the connector 80. The first portion of the dielectric is located within the center hole 89. The radius of the center hole 89 is such that the dielectric can provide the same or substantially the same within manufacturing tolerances impedance as the impedance as the dielectric of the coaxial cable. This allows for the coaxial structure of the coaxial cable to extend into the connector 80. The connector 80 also includes a groove 88 extending from the center hole 89 to the edge of the connector 80. The second portion of the dielectric is located within the groove 88. The groove 80 preferably has a semicircular shape. The radius of the semicircular-shaped groove 80 can have the same or substantially the same radius within manufacturing tolerances as the radius of the center hole 89. The combination of the groove 80 and the extension 87 more closely approximate a coaxial structure between the center pin and the interior surface of the connector 80 than just the groove in connectors 10, 30 parallel or substantially parallel to the surface of the PCB 90.

The connector 80 more closely approximates the coaxial structure of the coaxial cable compared to the prior art because the geometry of the dielectric more closely approximates the geometry of the dielectric of the coaxial cable by having approximately the same tube-like shape and because the closest interior surface of the connector 80 to the center pin (which corresponds to the center conductor of the coaxial cable) is much closer to the center pin than the closest interior surface of connectors 100, 150 is to the center pins 104, 154.

Although not shown in the FIG. 27, the connector 80 can also include legs similar to the legs 36 of FIGS. 7-10 that can be inserted into holes in a PCB to be grounded when the connector 80 is mounted to the PCB.

The connector 80 includes an extension 87 that extends from the bottom of the connector 30 such that the extension 87 extends into a slot 99 in the PCB 90 when the connector 80 is mounted to the PCB 90. The extension 87 does not need to be soldered to the PCB 90. The bottom of the extension 87 is preferably below the top surface of the PCB 90 and can be below the bottom surface of the PCB 90 but does not have to be.

The extension 77 preferably includes a radius whose length is the same or substantially the same within manufacturing tolerances of the length of the radius of the center hole 89 through which the center pin extends. Having the radius of the extension 87 be the same as the radius of the center hole 89 of the connector 80 allows the coaxial structure of the connector 80 to be extended to and through the PCB 90. The extension 87 preferably extends along the groove 88, providing a close conductive surface opposite to the groove 88 that approximates a coaxial structure along the groove 88. The extension 87 preferably has a slot that allows for easier insertion of the dielectric; however, it is possible that the extension 87 does not have a slot so that a vertical cross-section of the extension 87 along the groove 88 is semi-circular. The extension 87 can have any suitable thickness.

The extension 87 provides a three-dimensional interface between the connector 80 and the PCB 90, which improves the coaxial structure for signals transmitted between connector 80 and the PCB 90. The extension 87 replaces the discrete structure provided by the vias 118, 218 with a continuous structure, which improves the coaxial structure for signals transmitted through the connector 80. Although the extension 87 is preferably continuous, it is also possible to divide the extension 87 into discrete portions. The extension 87 provides a close conductive surface below the top surface of PCB 90 without having to provide any structures within the PCB 90. To provide a continuous conductive surface below the top surface of PCB 90 without using the extension 87 would require soldering, which would be difficult, if not impossible, to perform so close to the pin pad 94. The exact structure of the extension 87 can be more precisely controlled than using structures on and within the PCB 90 (e.g., ground planes 95, 96 and vias 98) because the casting and machining processes used to make the extension 87 are more precise than drilling, etching, and plating processes used to make the structures on and within the PCB 90.

FIGS. 28-30 show PCB 90 with a footprint according to a seventh preferred embodiment of the present invention that can be used with the connector 80. The footprint includes a base pad 92 and a pin pad 94. The base 82 is soldered to the base pad 92, and the center pin is soldered to the pin pad 94. The pin pad 94 is connected to a trace 93 that leads away from the pin pad 94. The footprint also includes a ground plane 95 that surrounds the trace 93.

FIG. 29 is a see-through perspective view of the footprint of FIG. 28 in which structures within the PCB 90 are shown using broken lines. These structures cannot normally be seen. The PCB 90 preferably includes multiple layers. The layer nearest to the surface of the PCB 90 includes a ground plane 96. The ground plane 96 includes an antipad 97 underneath the pin pad 94. The ground plane 96 is connected to the ground plane 95 on the top of the PCB 90 by vias 98. The reference lines for ground plane 96 and antipad 97 are broken to show that the ground plane 96 and the antipad 97 are within the PCB 90.

As shown in FIG. 30, the base pad 92 includes an outer base pad 92a and an inner base pad 92b that approximates a coaxial structure.

The footprint of FIG. 28 is different from the footprint of FIG. 11 in that the footprint of FIG. 28 includes slot 99 that preferably extends from the hole 89 in the connector 80 to the pin pad 94. The slot 99 preferably extends all the way through the PCB 40. However, it is possible the slot 99 is a groove in the PCB 90 that does not extend all the way through the PCB 40. If the slot 99 is a groove, then the height of the extension 87 will be less than the depth of the slot 99. The slot 99 is preferably precision-machined in the PCB 40.

The cutout 91 within the perimeter of the base pad 44 is adjacent to the pin pad 94. The slot 99 extending all the way to the pin pad 94 allows the center pin of the connector 90 to be connected to the pin pad 94 without being bent.

The preferred embodiments of the present invention transmit radio frequency (RF) signals and can preferably be used for 50 Ω and 75 Ω applications, for example. The preferred embodiments of the present invention are most advantageous for small pitch applications but still provide benefits for larger pitch applications.

The preferred embodiments of the present invention improve the coaxial structure for transmitting signals. Improving the coaxial structure improves the electrical isolation of the transmitted signal and restricts the electromagnetic fields of the transmitted signal in a smaller area, tightening the electromagnetic field focus.

Figure 15:
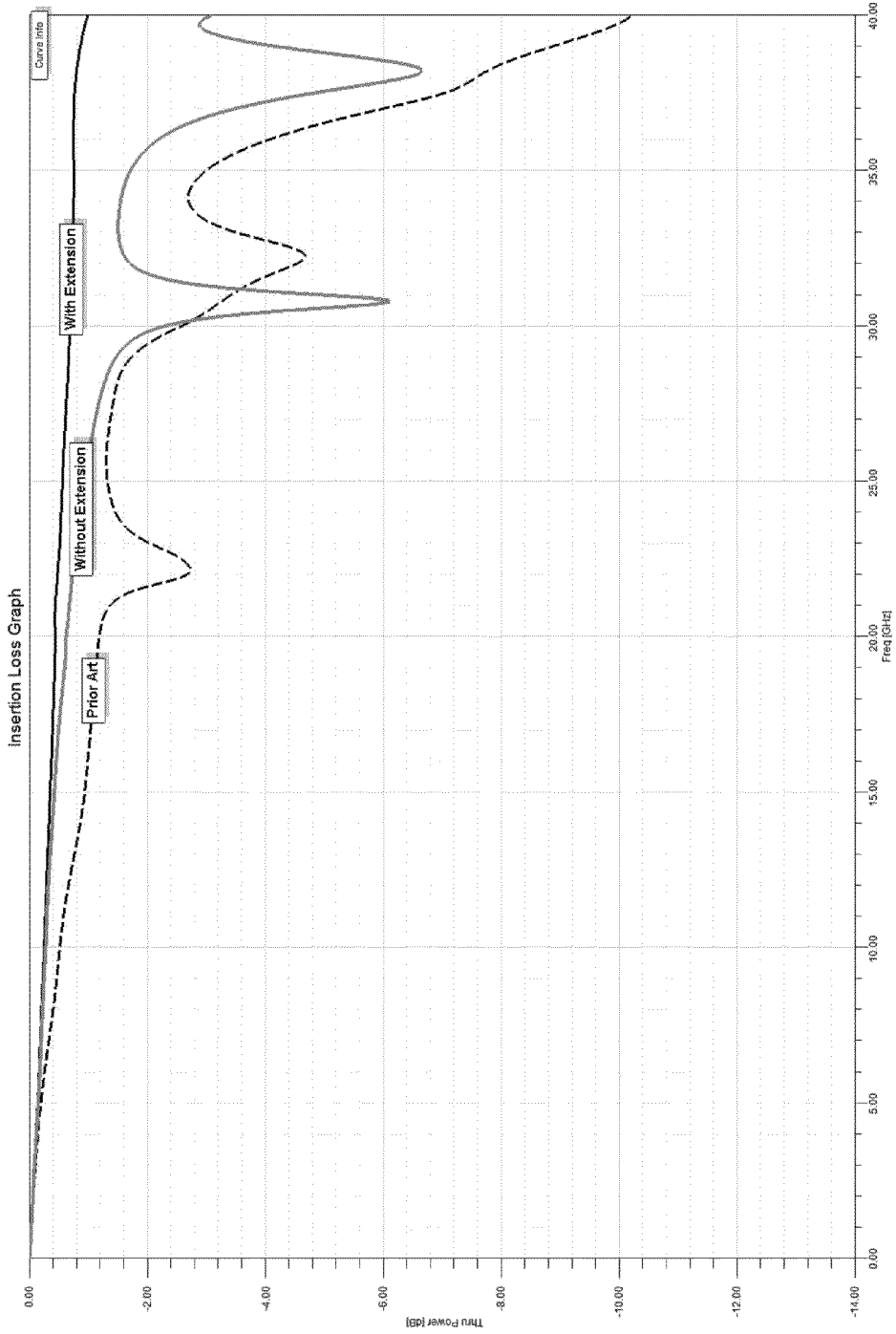
FIG. 15 is a graph showing the insertion loss for the known connector 100 of FIG. 19, the connector 10 of FIG. 1, and the connector 30 of FIG. 7.
Figure 16:
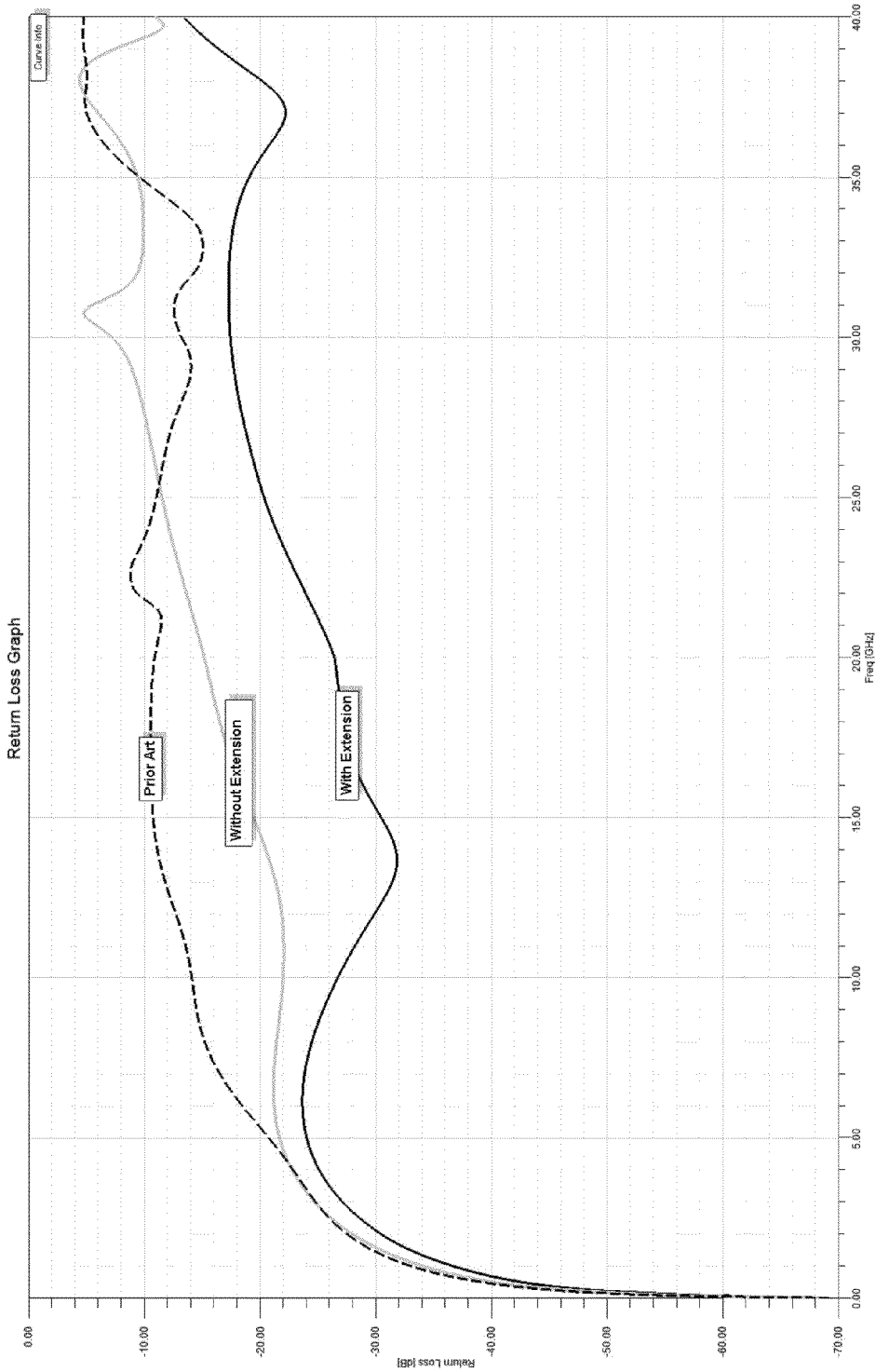
FIG. 16 is a graph showing the return loss for the known connector 100 of FIG. 19, the connector 10 of FIG. 1, and the connector 30 of FIG. 7.
Figure 17:
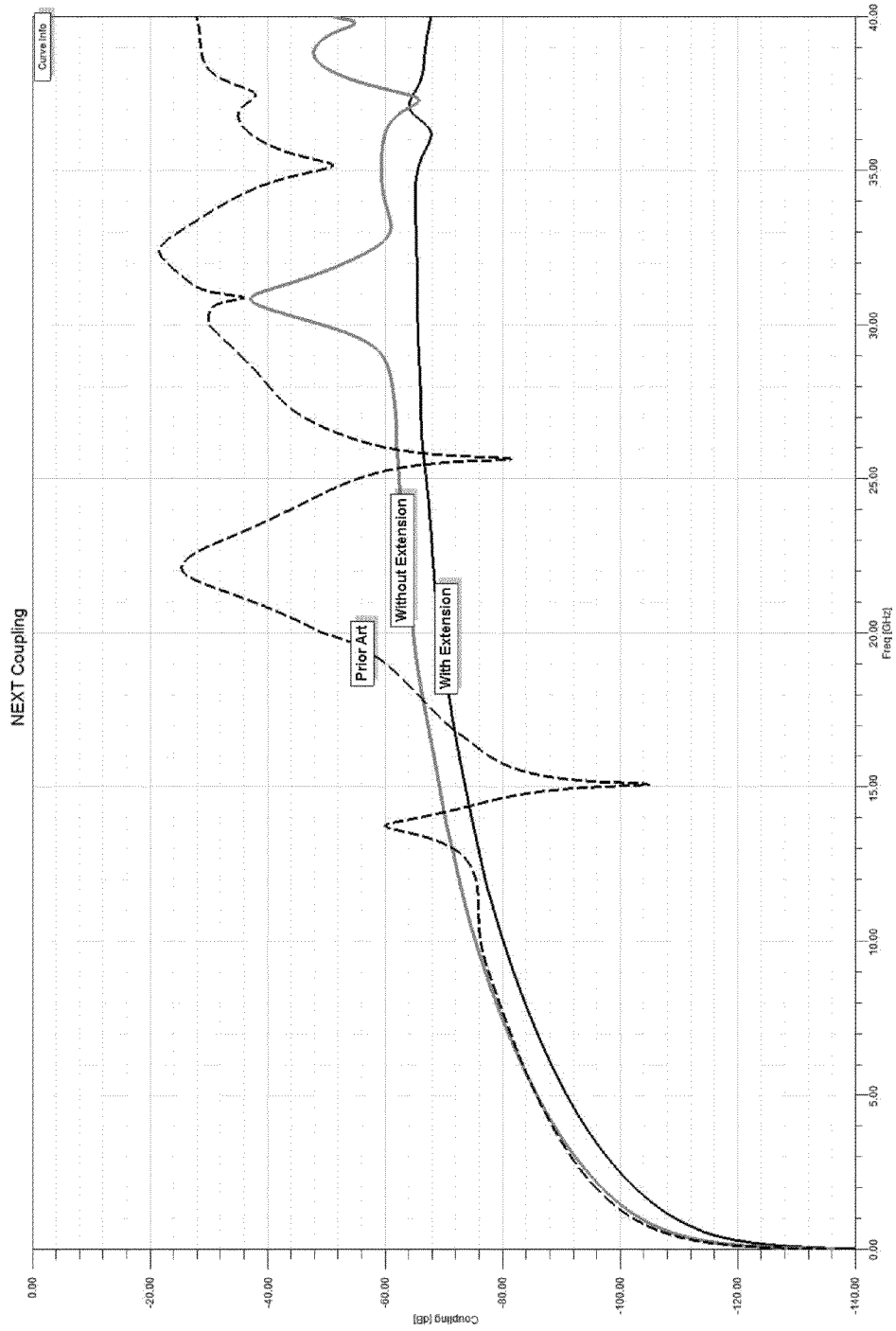
FIG. 17 is a graph showing near-end crosstalk (NEXT) for the known connector 100 of FIG. 19, the connector 10 of FIG. 1, and the connector 30 of FIG. 7.
Figure 18:
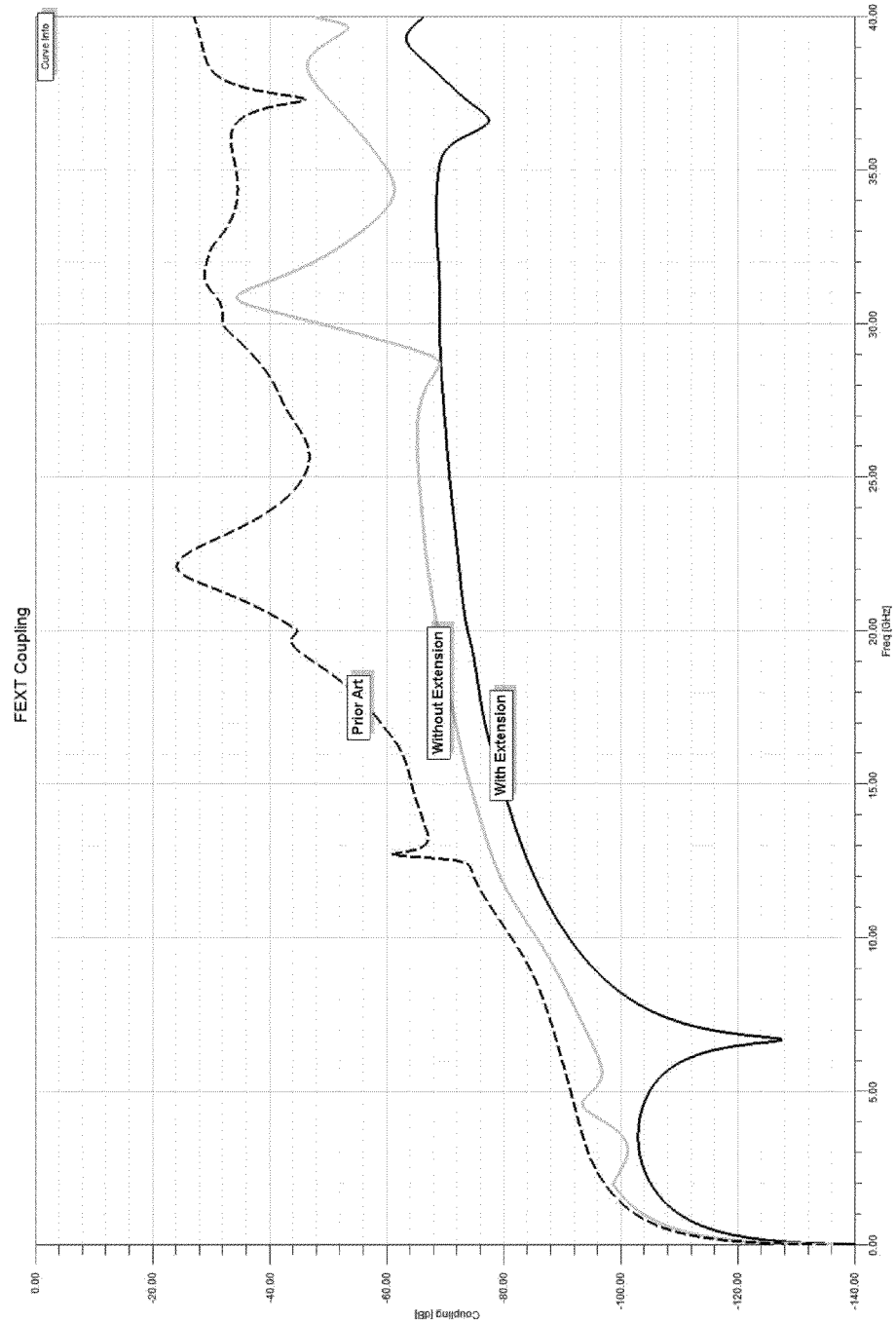
FIG. 18 is a graph showing the far-end crosstalk (FEXT) for the known connector 100 of FIG. 19, the connector 10 of FIG. 1, and the connector 30 of FIG. 7.
Figure 22:
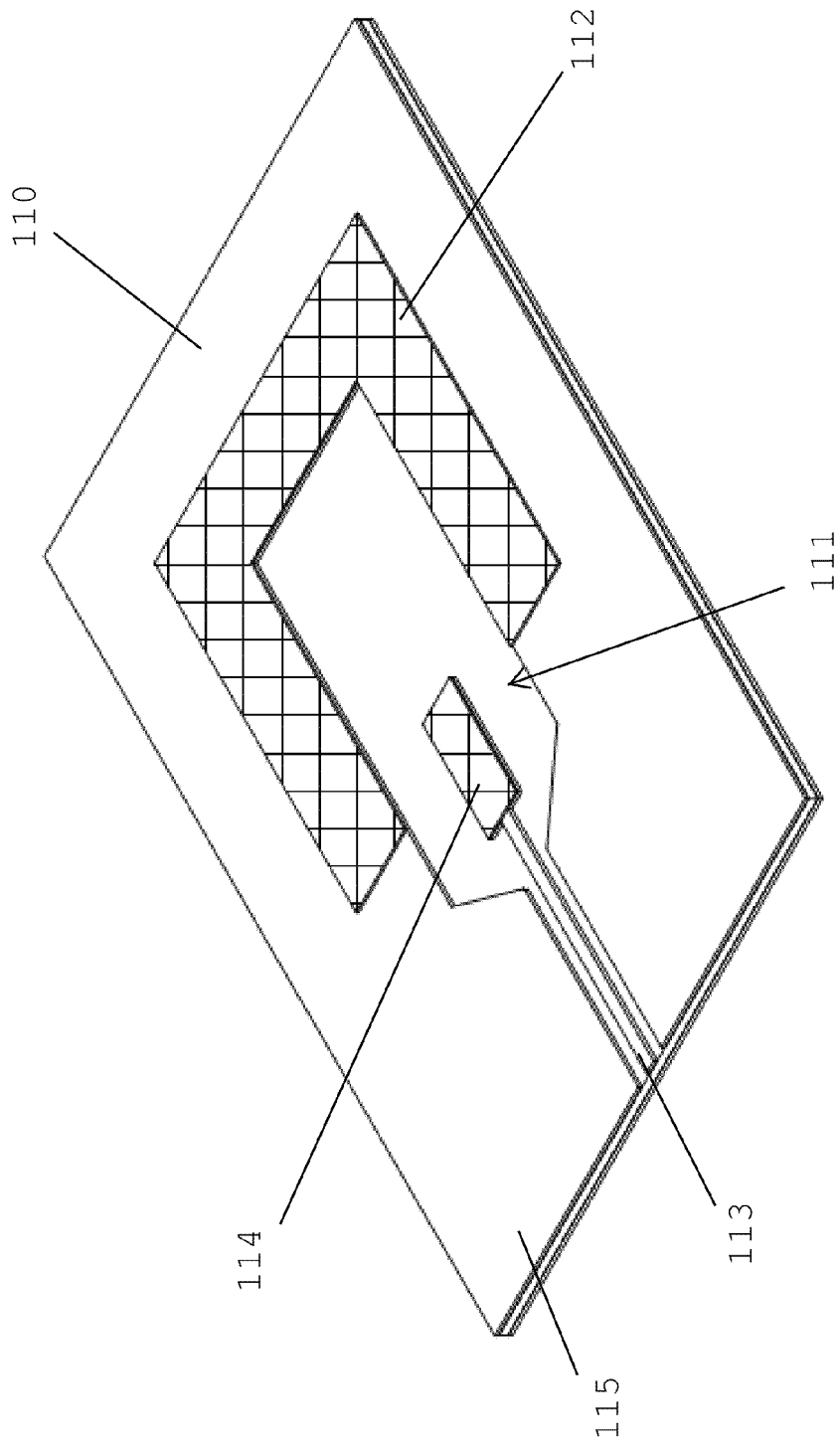
FIG. 22 is a perspective view of a known footprint.
Figure 23:
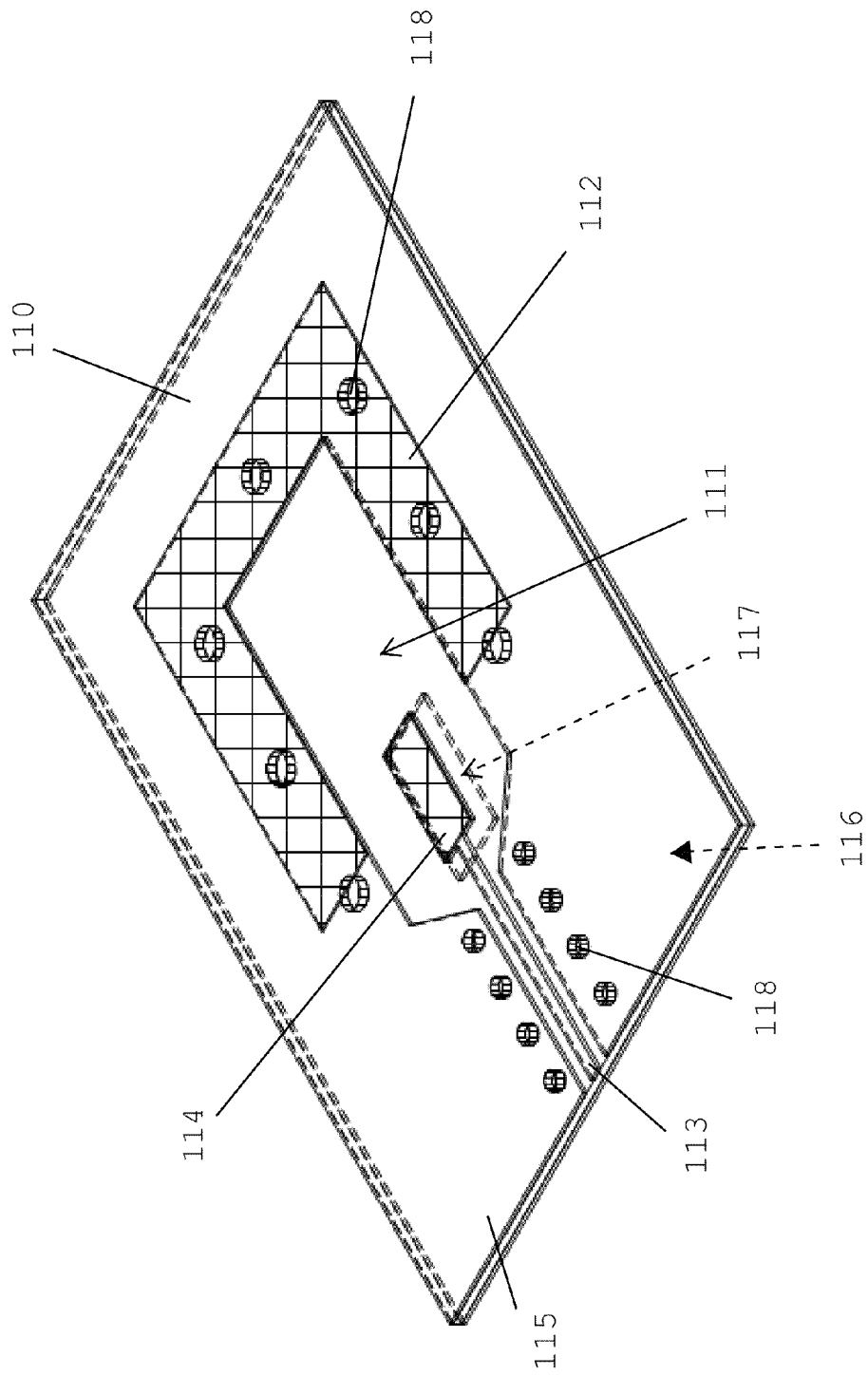
FIG. 23 is a see-through perspective view of the known footprint of FIG. 22.

In FIGS. 15-18, "Prior Art" refers to the assembly of the connector 100 mounted on the footprint of FIG. 22, "Without Extension" refers to the assembly of the connector 10 mounted on the footprint of FIG. 4, and "With Extension" refers to the assembly of the connector 30 mounted on the footprint of FIG. 11. FIG. 15 compares the insertion loss, FIG. 16 compares return loss, FIG. 17 compares the NEXT coupling, and FIG. 18 compares the FEXT coupling. As seen in FIGS. 15-18, the insertion loss, the return loss, and NEXT and FEXT coupling are improved by the preferred embodiments in the present invention.

The connectors of the preferred embodiments can be made in any suitable manner and can be made of any suitable material so long as the connectors provide a close conductive surface to which the signals can couple to. Instead of having a vertical arrangement as shown in the preferred embodiments discussed above, the connector can have a right angle arrangement in which the coaxial cables connected to the connector would extend parallel to the surface of the PCB. The housing of the connector is not limited to the circular horizontal cross-section as shown in the preferred embodiments above. The horizontal cross-section of the housing could be, for example, a square, an octagon, or any other suitable shape.

The dielectric of the preferred embodiments can be made in any suitable manner and can be made of any suitable dielectric material. The dielectric can be a single continuous piece or can be multiple discrete pieces. To allow the dielectric to bend, it is possible to cut a slot in the dielectric where the dielectric will bend.

The center pin of the preferred embodiments can be made in any suitable manner and can be made of any suitable conductive material.

It should be understood that the foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims.

What is claimed is:

1. A connector comprising:
   a housing including a conductive material;
   a base connected to the housing and including a base center hole and a base groove extending from the base center hole to an edge of the base;
   an extension protruding from the bottom of the base;
   a center pin including a first portion and a second portion extending perpendicular or substantially perpendicular to the first portion; and
   a dielectric including:
      a first portion extending through the base center hole and including a dielectric center hole through which the first portion of the center pin extends; and
      a second portion extending perpendicular or substantially perpendicular to the first portion of the dielectric along the base groove and including a dielectric groove along which the second portion of the center pin extends.

2. A connector of claim 1, wherein the extension has a semi-circular shape or a U-shape.

3. A connector of claim 1, wherein a radius of the extension and a radius of the base center hole are equal or substantially equal.

4. A connector of claim 1, further comprising a leg extending from the base.

5. A connector comprising:
   a housing including, a conductive material;
   a base connected to the housing and including a base center hole and a base groove extending from the base center hole to an edge of the base;
   a center pin including a first portion and a second portion extending perpendicular or substantially perpendicular to the first portion; and
   a dietric including:
      a first portion extending through the base center hole and including a dielectric center hole through which the first portion of the center pin extends; and
      a second portion extending perpendicular or substantially perpendicular to the first portion of the dielectric along the base groove and including a dielectric groove along which the second portion of the center pin extends; wherein a radius of the base center hole and a radius of the base groove are equal or substantially equal.

6. A connector comprising:
a housing including a conductive material;
a base connected to the housing and including a base center hole and a base groove extending from the base center hole to an edge of the base;
a center pin including a first portion and a second portion extending perpendicular or substantially perpendicular to the first portion; and
a dielectric including
    a first portion extending through the base center hole and including a sielectric center hole through which the first portion of the center pin extends; and
    a second portion extending perpendicular or substantially perpendicular to the first portion of the dielectric along the base groove and including a dielectric groove along which the second portion of the center pin extends; wherein
a radius of the first portion of the dielectric and a radius of the second portion of the dielectric are equal or substantially equal.

7. A printed circuit board comprising:
a base pad including an outer base pad portion and an inner base pad portion, the outer base pad portion is arranged to be connected to a base of a coaxial connector;
a pin pad arranged such that at least a portion of the pin pad is surrounded by the base pad and arranged to be connected to a center pin of the coaxial connector;
a trace connected to the pin pad; and
a first ground plane located on a top surface of the printed circuit board including an antipad that surrounds the pin pad and the trace; wherein
the antipad extends into an area defined by an inner perimeter of the inner base pad portion; and
the antipad has a radius that is equal to or substantially equal to a radius of a center hole in the coaxial connector.

8. A printed circuit board of claim 7, further comprising a slot.

9. A printed circuit board of claim 8, wherein the slot extends through the printed circuit board.

10. A printed circuit board of claim 8, wherein the slot has a radius that is equal to or substantially equal to the radius of the center hole in the coaxial connector.

11. A printed circuit board of claim 7, further comprising a second ground plane located on a layer nearest the top surface of the printed circuit board.

12. A printed circuit board of claim 11, further comprising vias connecting the second ground plane to at least one of the base pad and the first ground plane 13. A printed circuit board of claim 11, wherein the second ground plane includes an antipad under the pin pad.

14. A connector assembly comprising:
a connector including:
    a housing including a conductive material;
    a base connected to the housing including a base center hole and a base groove extending from the base center hole to an edge of the base;
    a center pin including a first portion and a second portion extending perpendicular or substantially perpendicular to the first portion;and
    a dielectric including:
        a first portion extending through the base center hole and including a dielectric cenetr hole through which the first portion of the center pin extends; and
        a second portion extending perpendicular or substantially perpendicular to the first portion of the dielectric along the base groove and including a dielectric groove along which the second portion of the center pin extends;
a printed circuit board including:
    a base pad connected to the base;
    a pin pad connected to the center pin;
    a trace connected to the pin pad; and
    a first ground plane located on a top surface of the printed circuit board including an antipad that surrounds the pin pad and the trace; wherein
the antipad extends into an area defined by an inner perimeter of the base pad; and
the antipad has a radius that is equal to or substantially equal to a radius of the center hole in the connector.

15. A connector assembly of claim 14, wherein:
the printed circuit board includes a slot; and
the connector includes an extension that protrudes into the slot so that a bottom surface of the extension is below a top surface of the printed circuit board.

16. A connector assembly of claim 15, wherein the bottom surface of the extension is below a bottom surface of the printed circuit.

* * * * *